(12) United States Patent
Nakashima et al.

(10) Patent No.: US 10,987,911 B2
(45) Date of Patent: Apr. 27, 2021

(54) METAL-CLAD LAMINATE SHEET MANUFACTURING METHOD, AND METAL-CLAD LAMINATE SHEET USING THE SAME

(71) Applicant: KURARAY CO., LTD., Kurashiki (JP)

(72) Inventors: Takahiro Nakashima, Ehime (JP); Takeshi Takahashi, Ehime (JP); Minoru Onodera, Ehime (JP)

(73) Assignee: KURARAY CO., LTD., Kurashiki (JP)

( * ) Notice: Subject to any disclaimer, the term of this patent is extended or adjusted under 35 U.S.C. 154(b) by 432 days.

(21) Appl. No.: 15/567,748

(22) PCT Filed: Apr. 20, 2016

(86) PCT No.: PCT/JP2016/002114
§ 371 (c)(1),
(2) Date: Oct. 19, 2017

(87) PCT Pub. No.: WO2016/170779
PCT Pub. Date: Oct. 27, 2016

(65) Prior Publication Data
US 2018/0134025 A1    May 17, 2018

(30) Foreign Application Priority Data

Apr. 20, 2015  (JP) .............................. JP2015-086222
Aug. 19, 2015  (JP) .............................. JP2015-162053

(51) Int. Cl.
*B32B 15/09*      (2006.01)
*B32B 38/00*      (2006.01)
(Continued)

(52) U.S. Cl.
CPC .......... *B32B 38/0036* (2013.01); *B29C 65/02* (2013.01); *B32B 3/263* (2013.01);
(Continued)

(58) Field of Classification Search
CPC .. H05K 3/38; H05K 2201/0141; B32B 15/08; B32B 2457/08; B32B 37/182
See application file for complete search history.

(56) References Cited

U.S. PATENT DOCUMENTS 6,274,242 B1   8/2001   Onodera et al.
6,616,796 B1   9/2003   Onodera et al.
(Continued)

FOREIGN PATENT DOCUMENTS

CN   1268429 A      10/2000
EP   1 044 800 A1   10/2000
(Continued)

OTHER PUBLICATIONS

Office Action dated Apr. 9, 2019 in European Patent Application No. 16782802.9.
(Continued)

*Primary Examiner* — Laura A Auer
(74) *Attorney, Agent, or Firm* — Oblon, McClelland, Maier & Neustadt, L.L.P.

(57) ABSTRACT

A method for manufacturing a metal-clad laminate sheet including forming a laminate sheet having the thermoplastic liquid crystal polymer film and the metal foil bonded together; and providing the laminate sheet with a heat treatment which satisfies conditions (1) and (2) below: (1) a heat treatment temperature ranges between 1° C. inclusive and 50° C. exclusive higher than a melting point of the thermoplastic liquid crystal polymer film. (2) a time for the heat treatment ranges from one second to 10 minutes.

4 Claims, 9 Drawing Sheets

(51) Int. Cl.
    *B29C 65/02*     (2006.01)
    *B32B 15/08*     (2006.01)
    *H05K 3/38*     (2006.01)
    *B32B 3/26*     (2006.01)
    *H05K 1/03*     (2006.01)
    *H05K 3/46*     (2006.01)
    *B32B 37/10*     (2006.01)
    *B32B 37/18*     (2006.01)

(52) U.S. Cl.
    CPC .............. *B32B 15/08* (2013.01); *B32B 15/09* (2013.01); *H05K 1/0353* (2013.01); *H05K 3/38* (2013.01); *H05K 3/381* (2013.01); *H05K 3/4611* (2013.01); *B32B 37/10* (2013.01); *B32B 37/182* (2013.01); *B32B 2457/08* (2013.01); *H05K 2201/0141* (2013.01); *H05K 2201/0145* (2013.01)

(56) References Cited

U.S. PATENT DOCUMENTS

2002/0170939 A1*   11/2002   Onodera ................. B32B 15/08
                                                                    228/58
2015/0079415 A1    3/2015   Fukuchi

FOREIGN PATENT DOCUMENTS

| | | |
|---|---|---|
| JP | 4-136038 A | 5/1992 |
| JP | 5-345387 A | 12/1993 |
| JP | 2000-264987 A | 9/2000 |
| JP | 2003-13156 A | 1/2003 |
| JP | 2003-25489 A | 1/2003 |
| JP | 2004/098308 A | 4/2004 |
| JP | 2007/268716 A | 10/2007 |
| JP | 2008/229995 A | 10/2008 |
| JP | 4216433 B2 | 1/2009 |
| JP | 2010-221694 A | 10/2010 |
| TW | I250077 B | 3/2006 |
| WO | 2011/093427 A1 | 8/2011 |
| WO | WO 2015/0079415 A1 | 10/2013 |

OTHER PUBLICATIONS

Supplementary European Search Report dated Dec. 21, 2017 in Patent Application No. 16782802.9, 5 pages.
Office Action dated Oct. 1. 2018 in European Patent Application No. 16782802.9, 4 pages.
International Search Report dated Jul. 19, 2016, in PCT/JP2016/002114 filed Apr. 20, 2016.

* cited by examiner

METAL-CLAD LAMINATE SHEET MANUFACTURING METHOD, AND METAL-CLAD LAMINATE SHEET USING THE SAME

TECHNICAL FIELD

The present invention relates to a method for manufacturing a metal-clad laminate sheet including film (hereinafter referred to as "thermoplastic liquid crystal polymer film") containing thermoplastic polymer (hereinafter referred to as "thermoplastic liquid crystal polymer") capable of forming an optically anisotropic molten phase. The present invention also relates to a metal-clad laminate sheet manufactured by this method.

BACKGROUND ART

Conventional metal-clad laminate sheets including thermoplastic liquid crystal polymer film excel in low moisture absorbency, heat resistance, chemical resistance, and electrical properties derived from thermoplastic liquid crystal polymer film, as well as in dimensional stability. Thanks to such features, the metal-clad laminate sheets are used as a material for circuit boards including flexible wiring boards and circuit boards for mounting semiconductors.

Of these metal-clad laminate sheets, for example, a proposed metal-clad laminate sheet includes thermoplastic liquid crystal polymer film, and a metal foil (surface roughness: 2 μm to 4 μm) bonded to at least one surface of the thermoplastic liquid crystal polymer film. A method for manufacturing the metal-clad laminate sheet includes, for example, thermocompression-bonding the thermoplastic liquid crystal polymer film and the metal foil together between heating rolls with the thermoplastic liquid crystal polymer film kept under tension to obtain a laminate sheet, and heat-treating the laminate sheet at or above the melting point of the thermoplastic liquid crystal polymer film. Here, the thermoplastic liquid crystal polymer film has a predetermined orientation of molecules. Since such a metal-clad laminate sheet includes a metal foil having great surface roughness, the provided metal-clad laminate sheet may have high peel strength between the metal foil and the thermoplastic liquid crystal polymer film. (See, for example, PATENT DOCUMENT1.)

CITATION LIST

Patent Documents

PATENT DOCUMENT 1: Japanese Patent No. 4216433.

SUMMARY OF THE INVENTION

Technical Problem

In recent years, common use of high-performance small electronics such as smart phones encourages development of parts with high density and improvement in performance of the electronics. Hence, there is a demand for metal-clad laminate sheets with excellent peel strength between thermoplastic liquid crystal polymer film and a metal foil and capable of dealing with high-frequency transmission signals (i.e., having a high frequency characteristic).

The metal-clad laminate sheet disclosed in PATENT DOCUMENT1 excels in peel strength between the thermoplastic liquid crystal polymer film and the metal foil; however, the metal-clad laminate sheet lacks the high frequency characteristic. This is problematic because it is difficult to balance an adhesion property and a high frequency characteristic.

A high frequency characteristic of a metal foil acting as a transmission line; that is an insertion loss, depends on a skin effect (a surface resistance) of the metal foil. Thus, the high frequency characteristic depends on a surface shape, in particular surface roughness (a ten point average surface roughness) Rz of the metal foil. A metal foil with a great Rz and high roughness has a high insertion loss, causing deterioration in high frequency characteristic; whereas, a metal foil with a small Rz and low roughness has a low insertion loss, causing improvement in high frequency characteristic. Hence, the metal foil with a small Rz and low roughness is desirable.

However, if the metal foil with low roughness is used to reduce a resistance of the skin effect and curb the insertion loss, the peel strength between the metal foil and the thermoplastic liquid crystal polymer film becomes insufficient. Despite various attempts to reduce the insertion loss and enhance the peel strength at the same time, none of the attempts has successfully solved the problem.

The present invention is conceived in view of the above problem, and intended to provide a method for manufacturing a metal-clad laminate sheet which has a high frequency characteristic and excels in peel strength between thermoplastic liquid crystal polymer film and a metal foil. The present invention is also intended to provide a metal-clad laminate sheet manufactured by the method.

Solution To The Problem

Inventors of the present invention have found out that when a metal foil having high roughness and thermoplastic liquid crystal polymer film are thermocompression-bonded together and heat-treated, peel strength between the metal foil and the thermoplastic liquid crystal polymer film could increase. However, the inventors have found out that when a metal foil having low roughness and thermoplastic liquid crystal polymer film of the present invention are thermocompression-bonded together to form a laminate and the laminate is heat-treated, peel strength between the metal foil and the thermoplastic liquid crystal polymer film does not necessarily increase. The inventors have further studied heat treatment conditions of the laminate and found out that, to their surprise, the peel strength increases when the heat treatment is continued until a certain time under a specific temperature condition, and decreases once the certain time has passed. Thus the inventors found out that the heat treatment temperature and the time condition are set within a specific range, which successfully increases the peel strength of the laminate including the metal foil having low roughness and the thermoplastic liquid crystal polymer film thermocompression-bonded together. This is how the inventors have come to the present invention.

Hence, the present invention provides a method for manufacturing a metal-clad laminate sheet including thermoplastic liquid crystal polymer film and a metal foil bonded to at least one surface of the thermoplastic liquid crystal polymer film. The method includes providing a heat treatment which satisfies conditions (1) and (2) below:

(1) a heat treatment temperature ranges between 1° C. inclusive and 50° C. exclusive higher than a melting point of the thermoplastic liquid crystal polymer film; and
(2) a time for the heat treatment ranges from one second to 10 minutes.

Moreover, a metal-clad laminate sheet of the present invention includes thermoplastic liquid crystal polymer film and a metal foil bonded to at least one surface of the thermoplastic liquid crystal polymer film. The thermoplastic liquid crystal polymer film is provided with a skin layer having a thickness below car equal to a surface roughness of the metal foil.

The present invention provides a method for manufacturing a multilayer circuit board including, a single-sided metal-clad laminate sheet and a substrate laminated together, the single-sided metal-clad laminate sheet including thermoplastic liquid crystal polymer film and a metal foil bonded to a surface of the thermoplastic liquid crystal polymer film, and the method comprising: forming a laminate sheet having the thermoplastic liquid crystal polymer film and the metal foil bonded together; and providing the laminate sheet with a heat treatment which satisfies conditions (1) and (2) below to manufacture the single-sided metal-clad laminate sheet.

(1) A heat treatment temperature ranges between 1° C. inclusive and 50° C. exclusive higher than a melting point of the thermoplastic liquid crystal polymer film.

(2) A time for the heat treatment ranges from one second to 10 minutes.

Advantages Of The Invention

The present invention can provide a metal-clad laminate sheet which has a high frequency characteristic and excels in peel strength. In particular, under the conditions of the present invention, a metal-clad laminate sheet provided in the present invention successfully has sufficient peel strength even when thermoplastic liquid crystal polymer film is laminated on a shiny side (i.e., a face not roughened) of a metal foil.

DETAILED DESCRIPTION

An embodiment of the present invention will be described in detail below, with reference to the drawings. The present invention is not limited to the embodiment below.

Figure 1:
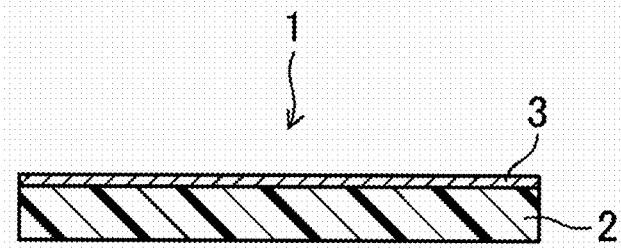
FIG. 1 is a cross-sectional view illustrating a structure of a metal-clad laminate sheet according to an embodiment of the present invention.

FIG. 1 is a cross-sectional view illustrating a structure of a metal-clad laminate sheet according to an embodiment of the present invention.

As illustrated in FIG. 1, a metal-clad laminate sheet 1 of this embodiment includes a thermoplastic liquid crystal polymer film 2 and a metal foil 3 laminated on one surface of the thermoplastic liquid crystal polymer film 2.

<Metal Foil>

The metal foil 3 of the present invention may be any given metal foil. Examples of the metal foil 3 are copper, gold, silver, nickel, aluminum, and stainless steel. Beneficially, the metal foil 3 may be a copper foil and a stainless-steel foil in view of electrical conductivity, handling and costs. Note that the copper foil may be manufactured by rolling and electrolysis.

Furthermore, the metal foil 3 may beneficially be chemically treated, such as acid cleaning commonly provided to a copper foil. Moreover, the metal foil 3 may beneficially have a thickness ranging from 9 µm to 200 µm, and more beneficially from 9 µm to 40 µm.

This is because if the metal foil 3 is thinner than 9 µm, the thickness is insufficient so that the metal foil 3 could be deformed to have, for example, a wrinkle in a manufacturing process of the metal-clad laminate sheet 1. If the metal foil 3 is thicker than 200 µm, the thickness is excessive so that, when the metal foil 3 is used as a flexible wiring board, the flexible wiring board could be hard to bend.

Moreover, in the present invention, the metal foil 3 may beneficially have mall surface roughness (i.e., low roughness), and in particular have a ten point average surface roughness Rz of smaller than 2.0 µm in view of an excellent high frequency characteristic. In addition the metal foil 3 may be 1.5 µm or thinner, and in particular 1.1 µm or thinner in view of a balance between a high frequency characteristic and peel strength. It is conventionally difficult to bond metal foil to thermoplastic liquid crystal polymer film when a bonding face of the metal foil is not roughened (a shiny side). However it is presently surprising that the present invention achieves excellent peel strength even though such a shiny side of the metal foil is laminated on the thermoplastic liquid crystal polymer film. The metal foil can be laminated when the shiny side has a roughness of 0.5 µm or lower to 0.3 µm.

Note that when the metal foil has a surface roughness of 2.0 μm or greater, the lamination could cause a rough texture on the surface of the metal foil roughened to penetrate a film skin layer inherent in a thermoplastic liquid crystal polymer film, and to reach a core layer inside the film. Hence even though the peel strength between the thermoplastic liquid crystal polymer film and the metal foil improves, it is difficult to achieve an excellent high frequency characteristic.

Specifically, metal foil to be used as the metal foil 3 has a surface roughness Rz of smaller than 2.0 μm, which exhibits an excellent high frequency characteristic. This is why the metal-clad laminate sheet 1 having excellent peel strength can be obtained.

Note that the "surface roughness" here is a ten point average surface roughness (Rz) of the metal foil measured with a contact surface roughness meter (manufactured by Mitsutoyo Corporation Ltd., Model: SJ-201). The surface roughness is roughness of a surface, of the metal foil 3, which makes contact with the thermoplastic liquid crystal polymer film 2.

Furthermore, the surface roughness s measured with a technique in compliance with ISO 4287-1997. More specifically, the surface roughness (Rz) is obtained as follows: A reference length is extracted from a roughness curve along an average line of the roughness curve. The sum of the average value of the top five heights (peaks of the convex curves) and the average value of the bottom five depths (bottoms of the concave curves) is represented in micrometers to be a ten point average surface roughness.

In general, commercially available metal foil has a surface roughened to enhance peel strength to, for example, resin film for lamination. In the present invention, such enhanced peel strength may be achieved even when a shiny side of metal foil, not roughened and having small surface roughness, and thermoplastic liquid crystal polymer film are laminated together. Thus, the present invention may implement a metal-clad laminate sheet which excels in high frequency characteristic, thanks to the low roughness of the metal foil, and may enhance the peel strength even if the surface of the metal foil is not roughened. Such features may improve work efficiency and reduce costs.

<Thermoplastic Liquid Crystal Polymer Film>

Materials for the thermoplastic liquid crystal polymer film of the present invention are not limited to any particular ones. Examples of the materials may be known thermotropic liquid crystal polyester and thermotropic liquid crystal polyester amid derived from compounds classified into (1) to (4) illustrated as examples below and derivatives of the compounds. As a matter of course, the material compounds may be combined within an appropriate scope in order to obtain polymer capable of forming an optically anisotropic molten phase.

(1) Aromatic or Aliphatic Dihydroxy Compound. (See Table 1 for typical examples.)

TABLE 1

Chemical Structural Formulas for Typical Examples
of Aromatic or Aliphatic Dihydroxy Compound

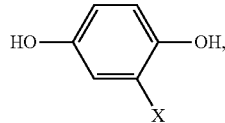

(X represents a hydrogen atom or a halogen atom, and a group such as a lower alkyl group X and a phenyl group.)

TABLE 1-continued

Chemical Structural Formulas for Typical Examples
of Aromatic or Aliphatic Dihydroxy Compound

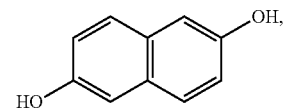

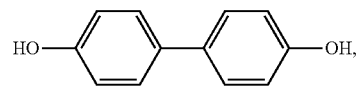 [SMILES: Oc1ccc(-c2ccc(O)cc2)cc1]

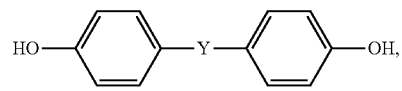

(Y represents a group such as —O—, —CH$_2$—, —S—)

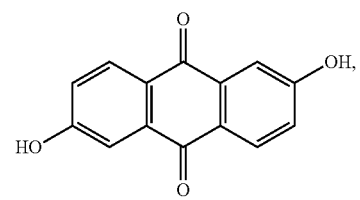 [SMILES: O=C1c2ccc(O)cc2C(=O)c2ccc(O)cc21]

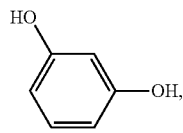

HO(CH$_2$)$_n$OH
(n is an integer from 2 to 12.)

(2) Aromatic or Aliphatic Dicarboxylic Acid. (See Table 2 for typical examples.)

TABLE 2

Chemical Structural Formulas for Typical Examples
of Aromatic or Aliphatic Dicarboxylic Acid

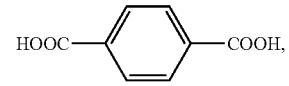

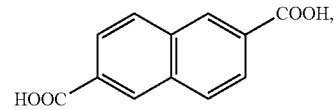

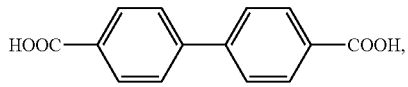 [SMILES: O=C(O)c1ccc(-c2ccc(C(=O)O)cc2)cc1]

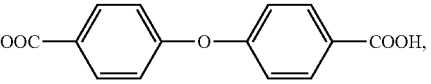

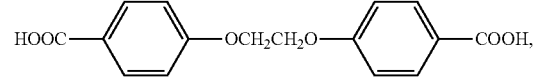

TABLE 2-continued

Chemical Structural Formulas for Typical Examples
of Aromatic or Aliphatic Dicarboxylic Acid

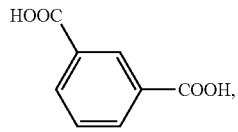 [SMILES: O=C(O)c1cccc(C(=O)O)c1]

HOOC(CH$_2$)$_n$COOH
(n is an integer from 2 to 12.)

(3) Aromatic Hydroxycarboxylic Acid (See Table 3 for typical examples.)

TABLE 3

Chemical Structural Formulas for Typical
Examples of Aromatic Hydroxycarboxylic Acid

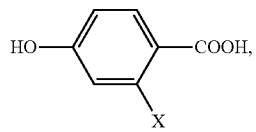

(X represents a hydrogen atom or a halogen atom, and a group such as
a lower alkyl group X and a phenyl group.)

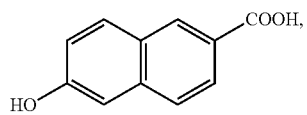

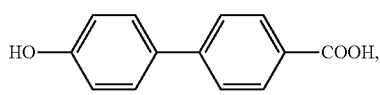 [SMILES: O=C(O)c1ccc(-c2ccc(O)cc2)cc1]

TABLE 3-continued

Chemical Structural Formulas for Typical
Examples of Aromatic Hydroxycarboxylic Acid

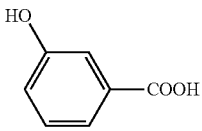

(4) Aromatic Diamine, Aromatic Hydroxyamine, or Aromatic Aminocarboxylic Acid (See Table 4 for typical examples.)

TABLE 4

Chemical Structural Formulas for Typical Examples of Aromatic
Diamine, Aromatic Hydroxyamine, or Aromatic Aminocarboxylic Acid

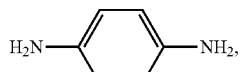

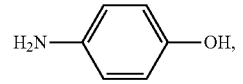

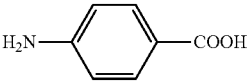

Moreover, typical examples of the thermoplastic liquid crystal polymer to be obtained as these material compounds include copolymers (a) to (e) having structure units illustrated in Table 5.

TABLE 5

Typical Examples of Thermoplastic Liquid Crystal Polymer

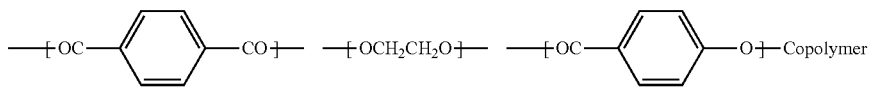

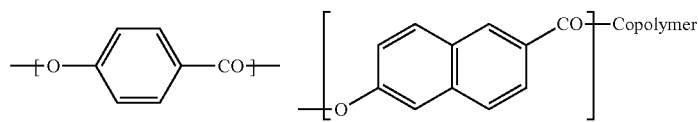

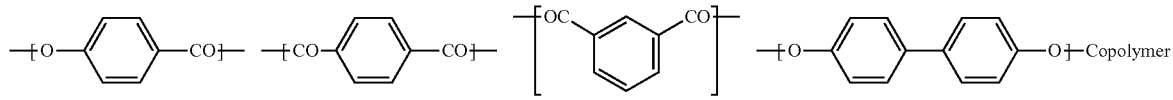

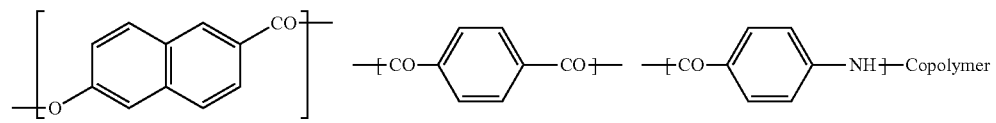

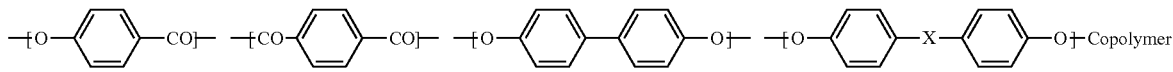

(X represents a group such as —O—, —CH$_2$—, —S—)

Furthermore, the thermoplastic liquid crystal polymer to be used for the present invention beneficially has a melting point, ranging approximately from 200° C. to 400° C., in particular, approximately from 250° C. to 300° C. in order to provide the film with desired heat resistance and workability. In view of manufacturing the film however, the thermoplastic liquid crystal polymer beneficially has a relatively low melting point.

Hence, when the heat resistance and the melting point need to be higher, the film obtained already is heat-treated so that the heat resistance and the melting point may be raised to a desired degree. As an example of a condition for heat treatment, when film already obtained has a melting point of 283° C. the melting point will rise to 320° C. if the film is heated at 260° C. for five hours.

The thermoplastic liquid crystal polymer film 2 of the present invention is obtained when the above polymer is extruded. Here, the polymer may be extruded by any technique. Well-known techniques such as T-die extrusion, stretching a laminated body, and inflation are industrially advantageous. In particular, in the inflation, stress is applied not only in a machine axis (longitudinal) direction (hereinafter referred to as an "MD" direction) of the film, but also in a direction perpendicular to the MD direction (hereinafter referred to as a "TD" direction). Hence, the obtained film is well balanced between mechanical and thermal properties in the MD and TD directions.

Moreover, the thermoplastic liquid crystal polymer film 2 of this embodiment beneficially has an orientation of molecules (SOR: Segment Orientation Ratio) between 0.90 or above and below 1.20, beneficially 0.95 or above and 1.15 or below, and more beneficially 0.97 or above and 1.15 or below in the film MD direction.

The thermoplastic liquid crystal polymer film 2 whose orientation of molecules is within this range is well-balanced between mechanical and thermal properties in the MD and TD directions. Thanks to such a feature, the thermoplastic liquid crystal polymer film 2 is not only practical but also, as described above, provides the metal-clad laminate sheet 1 for a circuit board with good isotropy and dimensional stability.

Moreover, when the orientation of molecules SOR is 0.50 or below or 1.50 or above, the orientation of the liquid crystal polymer molecules is excessively biased so that the film becomes hard and susceptible to be torn in the TD direction or the MD direction. For the use of circuit boards, which requires morphological stability such as no warping when heated, the orientation of molecules SOR needs to be 0.90 or above and below 1.15. In particular, the orientation of molecules SOR is desirably 0.90 or above and 1.08 or below if the warping when heated is to be completely eliminated. Moreover, when the orientation of molecules is set to 0.90 or above and 1.08 or below, a permittivity of the film may become constant.

Here, the "orientation of molecules SOR" is an index to provide a degree of a molecular orientation to a segment included in molecules. In contrast to a conventional molecular orientation ratio (MOR), the orientation of molecules SOR is deter mined on the ground of a thickness of an object.

Moreover, the above orientation of molecules SOR is calculated below.

First, using a well-known a microwave molecular orientation measurement device, the thermoplastic liquid crystal polymer film 2 is inserted into a microwave resonant waveguide of the device so that the film face is perpendicular to a traveling direction of the microwave. The device measures electric field strength of the microwave (transmission strength of a microwave) transmitted through this film.

Then, based on this measured value, a value m (referred to as a refractive index) is calculated by Math. 1 below.

(Math. 1)

$$m = (Zo/\Delta z) \times [1 - v_{max}/v_o] \quad (1)$$

where Zo is a device constant, $\Delta z$ is an average thickness of an object, vmax is an oscillation frequency to provide the maximum microwave transmission strength when a microwave oscillation frequency is changed, and vo is an oscillation frequency to provide the maximum microwave transmission strength when the average thickness is zero (i.e., when no object is found).

Next, the orientation of molecules SOR is calculated by m0/m90 where: (i) m0 is a value of m when a rotation angle with respect to an oscillation direction of the microwave is 0° (i.e., when the oscillation direction of the microwave matches a direction in which molecules of the object are most appropriately oriented (generally the MD direction of the extruded film), and the minimum microwave transmission strength is provided: and (ii) m90 is a value of in when the rotation angle is 90°.

The thickness of the thermoplastic liquid crystal polymer film 2 of the present invention is not limited to a particular thickness. When the metal-clad laminate sheet 1, including the thermoplastic liquid crystal polymer film 2 as an electrically insulating material, is used as a wiring board, the thickness beneficially ranges from 20 μm to 500 μm, more beneficially from 20 μm to 150 μm, still more beneficially from 20 μm to 100 μm, and most beneficially from 20 μm to 50 μm.

This is because when the thickness of the film is excessively thin, the rigidity and strength of the film become small. When an electronic part is mounted on a printed wiring board to be obtained, this excessively thin film causes deformation of the printed wiring board due to application of pressure, followed by deterioration of precision in wiring position to cause malfunction.

Moreover, the thermoplastic liquid crystal polymer film 2 has a coefficient of thermal expansion beneficially ranging from 10 ppm/° C. to 30 ppm/° C., more beneficially from 12 ppm/° C. to 25 ppm/° C., and further beneficially from 15 ppm/° C. This is because, when a circuit is formed on the metal-clad laminate sheet, the film could (i) contract if the coefficient of thermal expansion is smaller than 10 ppm/° C., and (ii) expand if the coefficient of thermal expansion is greater than 30 ppm/° C. Note that the coefficient of thermal expansion is a value to be measured by a technique described in Examples later. Beneficially, the thermoplastic liquid crystal polymer film 2 has a coefficient of thermal expansion ranging from 10 ppm/° C. to 30 ppm/° C. because the metal-clad laminate sheet 1 has a small dimensional variation.

Furthermore, the dimensional stability (occurrence of distortion) of the metal-clad laminate sheet 1 may be determined using, as an index, a dimensional variation based on a metal-clad laminate sheet with metal foil and a metal-clad laminate sheet without metal foil. If the dimensional variation is not over ±0.1%, the occurrence of distortion in the metal-clad laminate sheet 1 is reduced.

Note that the "dimensional variation" here is obtained as follows: Reference points in the MD and TD directions are determined on the heat-treated metal-clad laminate sheet by a technique in compliance with IPC-TM6502.2.4. After the metal foil is etched, the metal-clad laminate sheet 1 is baked at 150° C. for 30 minutes. Rates of variation in dimension (%) in the MD and TD directions are measured based on the positions of the reference points after the baking. The average value of the measured rates of variation in dimension is the "dimensional variation".

As an electrically insulating material for a main circuit board of a personal computer, a complex of the above thermoplastic liquid crystal polymer film and another electrically insulating material such as a glass-based material may be used. Note that the film may contain an additive such as a lubricant and an antioxidant.

Described next is a method for manufacturing a metal-clad laminate sheet according to an embodiment of the present invention.

The manufacturing method according to this embodiment includes: forming a laminate sheet having the thermoplastic liquid crystal polymer film 2 and the metal foil 3 bonded together; and providing the laminate sheet with heat treatment.

<Forming Laminate Sheet>

First, the thermoplastic liquid crystal polymer film 2 elongated is placed in a state of tension. On one face of the thermoplastic liquid crystal polymer film 2, the metal foil 3 elongated is laid. The thermoplastic liquid crystal polymer film 2 and the metal foil 3 are thermocompression-bonded between heating rolls and laminated together.

Note that the "state of tension" here is that a tensile force ranging from 0.12 kg/mm² to 0.28 kg/mm², for example, is applied to the film in the film MD direction (a direction of tension).

Figure 3:
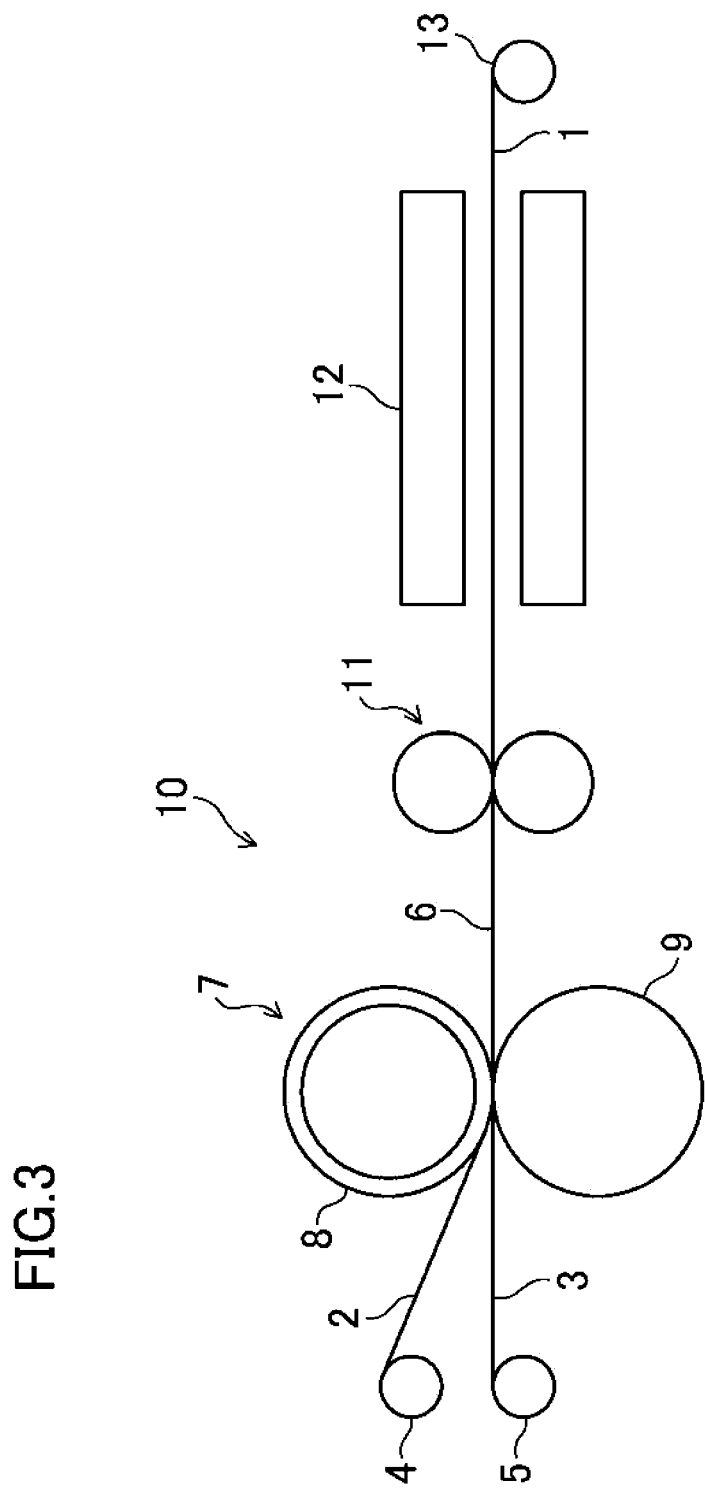
FIG. 3 is a schematic view illustrating an overall configuration of a continuous hot-press apparatus to be used in a method for manufacturing the metal-clad laminate sheet according to the embodiment of the present invention.

FIG. 3 is a schematic view illustrating an overall configuration of a continuous hot-press apparatus to be used in a method for manufacturing a metal-clad laminate sheet according to an embodiment of the present invention.

This continuous hot-press apparatus 10 is for manufacturing a single-sided metal-clad laminate sheet including the thermoplastic liquid crystal polymer film 2 and the metal foil 3 bonded to one of the surfaces of the thermoplastic liquid crystal polymer film 2. As illustrated in FIG. 3, the continuous hot-press apparatus 10 includes a delivery roll 4 loaded with the thermoplastic liquid crystal polymer film 2 in a roll shape, a delivery roll 5 loaded with the metal foil 3 such as topper foil in a roll shape, and a heating roll 7 bonding the thermoplastic liquid crystal polymer film 2 and the metal foil 3 together by thermocompression-bonding to form the laminate sheet 6.

When a single-sided metal-clad laminate sheet is manufactured, examples of the heating roll 7 include a pair of a heat-resistant rubber roll 8 and a heating metal roll 9 (both of which have a roll face hardness degree of 80 or above). Beneficially, the heat-resistant rubber roll 8 is positioned close to the thermoplastic liquid crystal polymer film 2, and the heating metal roll 9 is positioned close to the metal foil 3.

In accordance with a test to be carried out beneficially with a type-A spring-loaded hardness testing machine in compliance with JIS K 6301, the heat-resistant rubber roll 8 to be used in manufacturing a single-sided metal-clad laminate sheet beneficially has a roll face hardness degree of 80 or above, and more beneficially ranging from a roll face hardness degree of 80 to 95. Here, if the hardness degree is below 80, pressure in thermocompression bonding is insufficient, and so is peel strength of the laminate sheet 6. Furthermore, if the hardness degree exceeds 95, locally linear pressure acts between the heat-resistant rubber roll 8 and the heating metal roll 9. This could give the laminate sheet 6 poor appearance. Note that rubber having the hardness of 80 or above may be obtained when a vulcanization accelerator such as a vulcanizing agent and an alkaline material is added to synthetic rubber such as silicone rubber and fluorinated rubber or natural rubber.

Then, as illustrated in FIG. 1, the thermoplastic liquid crystal polymer film 2 and the metal foil 3 are laid one on top of the other, transported in the film MD direction, and supplied between a pair of the heat-resistant rubber roll 8 and the heating metal roll 9. Then, the thermoplastic liquid crystal polymer film 2 and the metal foil 3 are thermocompression-bonded and laminated together.

<Heat Treating>

Next the obtained laminate sheet 6 is heat-treated so that the metal-clad laminate sheet 1 is produced. As illustrated in FIG. 3, the continuous hot-press apparatus 10 includes: a nip roll 11 for transporting the laminate sheet 6; a heat treatment unit 12 for heat-treating the laminate sheet 6; and a wind-up roll 13 for winding up the heat-treated metal-clad laminate sheet 1.

The heat treatment unit 12 may be any given unit if the unit provides a heat treatment to the laminate sheet 6 at a melting point of the thermoplastic liquid crystal polymer film 2 or above. Examples of the heat treatment unit 12 include a hot-air heat treatment furnace, a hot-air circulation-type dryer, a heating roll, a ceramic heater, a heat treatment unit using a far-infrared ray, and a method using a combination thereof. Moreover, in view of reducing oxidization of a surface of the metal foil 3, heated nitrogen gas is used to heat-treat the laminate sheet 6 under an inert atmosphere having an oxygen concentration of 0.1% or below.

Here, where Tm (° C.) is a melting point of the thermoplastic liquid crystal polymer film 2 and Ta (° C.) is a heat treatment temperature, a feature of the present invention is that the laminate sheet 6 is heat-treated for one second to 10 minutes at the temperature Ta ranging between 1° C. inclusive and 50° C. exclusive higher than the melting point Tm of the thermoplastic liquid crystal polymer film.

Such a heat treatment to the laminate sheet 6 may enhance the peel strength between a metal foil having low roughness and thermoplastic liquid crystal polymer film, which has conventionally been difficult. In, particular, the peel strength is enhanced between thermoplastic liquid crystal polymer film and metal foil having a surface roughness Rz of smaller than 2.0 μm which excels in high frequency characteristic.

This heat treatment technique makes it possible to sufficiently improve peel strength between thermoplastic liquid crystal polymer film and a non-roughened shiny side of metal foil which has conventionally hindered such peel strength to the thermoplastic liquid crystal polymer film.

Note that, in view of further improving the peel strength between the thermoplastic liquid crystal polymer film 2 and the metal foil 3, the heat treatment temperature Ta may beneficially be set to a temperature ranging from 1° C. to 30° C., and more beneficially ranging from 2° C. to 30° C., higher than the melting point Tm of the thermoplastic liquid crystal polymer film. Moreover, in a similar view point, the heat treatment time is beneficially set to five seconds to eight, minutes, more beneficially to eight seconds to five minutes, and further more beneficially to eight seconds to three minutes.

Furthermore, under the above heat treatment condition, the peel strength between metal foil having low roughness and thermoplastic liquid crystal polymer film is inferred to improve because of the reason below. When the thermoplastic liquid crystal polymer film is usually thermocompression-bonded to the metal foil, a surface of the thermoplastic liquid crystal polymer film melts by the heat of the thermocompression-bonding, and an orientation of molecules referred to as a skin layer appears on the surface by the pressure in the thermocompression-bonding.

Figure 14:
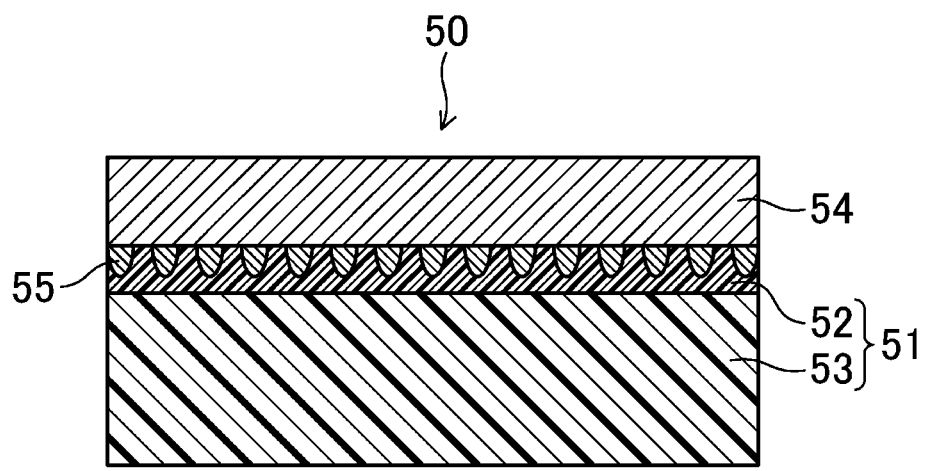
FIG. 14 is a cross-sectional view illustrating a structure of a conventional metal-clad laminate sheet.

As illustrated in FIG. 14, in a conventional metal-clad laminate sheet 50, a skin layer 52 of a thermoplastic liquid crystal polymer film 51 is susceptible to a tear n one direction structure-wise compared with a core layer 53 within the film, and the skin layer 52 is different also in crystalline structure from the core layer 53. Hence, the interface adhesion between the core layer 53 and the skin layer 52 is weak such that the core layer 53 and the skin layer 52 are susceptible to delamination at the interface. That is why this skin layer 52 reduces the peel strength between the thermoplastic liquid crystal polymer film 51 and a metal foil 54 even though a convex protrusion 55 of the metal foil 54 reaches the skin layer 52.

Figure 2:
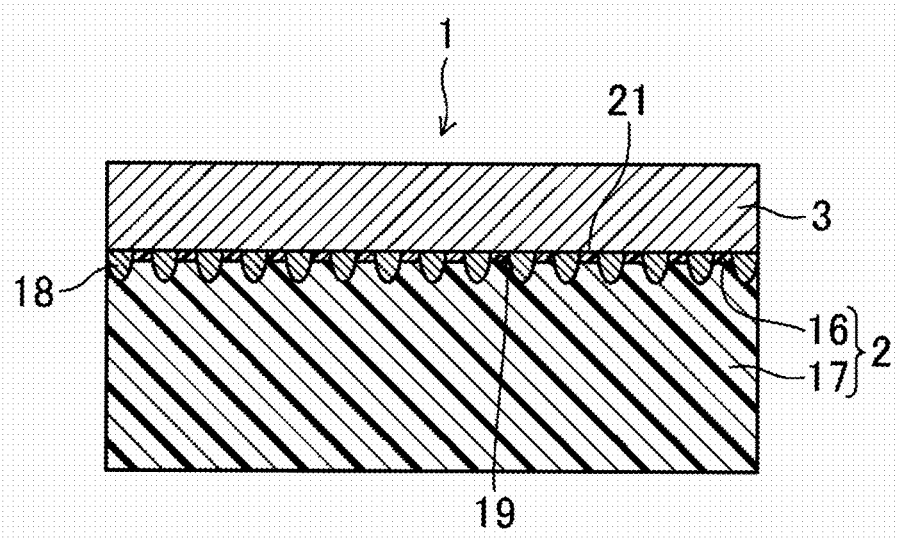
FIG. 2 is a cross-sectional view illustrating a structure of the metal-clad laminate sheet that is heat-treated according to the embodiment of the present invention.

In this embodiment, however, the thermoplastic liquid crystal polymer film 2 and the metal foil 3 are thermocompression-bonded together and, with no pressure applied, heat-treated at a temperature higher than or equal to the melting point of the thermoplastic liquid crystal polymer film 2. Hence, the once formed orientation of the skin, layer disappears (i.e., the factor to reduce the peel strength disappears), and the skin layer 16 becomes thinner. Accordingly, as illustrated in FIG. 2, a convex protrusion 18 of the metal foil 3 penetrates the skin layer 16 and reaches the core layer 17. As a result, the peel strength is thought to improve.

Specifically, in the present invention, the thermoplastic liquid crystal polymer film 2 and the metal foil 3 are thermocompression-bonded together and, with no pressure applied, heat-treated at a temperature higher than or equal to the melting point of the thermoplastic liquid crystal polymer film 2. Hence, the thickness of the skin layer 16 of the thermoplastic liquid crystal polymer film 2 may be set below or equal to the surface roughness of the metal foil 3. As a result, regardless of the surface roughness of the metal foil 3, the obtained metal-clad laminate sheet 1 may have sufficient peel strength even though the roughness of the metal foil 3 is low.

Here, the thickness of the skin layer 16 is defined by a distance between (i) a boundary interface 19 between the skin layer 16 and the core layer 17 and OD a surface 21, of the thermoplastic liquid crystal polymer film 2, to the skin layer 16. The thickness of the skin layer 16 of the present invention is an average value of thicknesses of any given five portions of the skin layer 16 within an area of 30 μm×30 μm observed in a cross-section image.

Note that the boundary interface 19 between the skin layer 16 and the core layer 17 is observed as a black cross section in the thermoplastic liquid crystal polymer film 2 when a cross section of the metal-clad laminate sheet 1 is polished with a cross-section polisher and etched with a propylamine solution. This is because when the skin layer 16 is formed on the thermoplastic liquid crystal polymer film 2 by the heat and pressure generated in the thermocompression bonding, small domain groups are formed between the skin layer 16 and the core layer 17. These small domain groups are dissolved and removed with the propylamine solution, which is probably why the boundary interface 19 is observed as the black cross section. Note that a scanning electron microscope is suitable as a unit for the observation.

Moreover, in view of peel strength, a thickness T of the skin layer 16 is beneficially smaller than or equal to 95% of the surface roughness Rz of the metal foil 3 (i.e., $T/Rz \leq 0.95$), more beneficially smaller than or equal to 50%, and still more beneficially smaller than or equal to 20%. This is because when the thickness T is larger than 95% of the surface roughness Rz, the skin layer 16 and the core layer 17 may delaminate from each other at the interface.

Furthermore, as long as the thickness T of the skin layer 16 is smaller than or equal to the surface roughness Rz, the thickness T of the skin layer 16 may be larger than or equal to either 1% or 5% of the surface roughness Rz of the metal foil 3. Furthermore, for example, a relationship $0.05 \leq T/Rz \leq 0.95$ may hold.

Moreover, in view of peel strength, the thickness of the skin layer 16 may beneficially be 1.1 μm or smaller, more beneficially 0.9 μm or smaller, and still more beneficially, 0.5 μm or smaller, and most beneficially 0.3 μm or smaller.

In addition, when metal foil with low roughness is used as the present invention shows, the peel strength increases to a peak and then starts to decrease if the heat treatment is continued. One of the reasons for the decrease in the peel strength would be thermal degradation of the thermoplastic liquid crystal polymer film. However, such a phenomenon does not occur when metal foil with high roughness is used.

Hence, a cause of this phenomenon was studied through an observation of delamination between a face of the thermoplastic liquid crystal polymer film and a face of metal foil in a laminate. Specifically, when a heat treatment was kept provided to the laminate, the peel strength once increased between the thermoplastic liquid crystal polymer film and the metal foil with low roughness decreased. The face of the film delaminated from the metal foil was observed in detail. The observation showed that, of concave recesses and convex protrusions formed on the surface of the metal foil, the convex protrusions were attached to the face of the film.

This result shows that, when the heat treatment is kept provided to the laminate using the metal foil with low roughness, a cause of the phenomenon of the decrease in the peel strength could be thermal degradation of the concave recesses and the convex protrusions on the surface of the metal foil. Specifically, in the case of the metal foil with low roughness the convex protrusions are small in size and susceptible to thermal degradation. In lamination, these convex protrusions dig into the surface of the thermoplastic liquid crystal polymer film to enhance the peel strength. Meanwhile, the convex protrusions become brittle by heat, and tend to come off together with the film when the film is delaminated from the metal foil. Hence, continuing the heat treatment could reduce the peel strength.

Meanwhile, metal foil with high roughness is originally high in peel strength to the film. In addition, the convex protrusions on the surface of the metal foil are large in size. These convex protrusions are tolerant to heat and excel in resistance to thermal degradation, reducing thermal degradation of the surface of the metal foil due to the heat treatment. Despite the heat treatment contributing to the thermal degradation of thermoplastic liquid crystal polymer film, no decrease in peel strength is thought to be observed.

Moreover, in the metal foil, the shiny side that s nest roughened does not have any concave recesses or convex protrusions to be formed to increase the peel strength. When the thermoplastic liquid crystal polymer film is laminated on this shiny side, the decrease in the peel strength by the heat treatment is also observed. This would be because of the following reason: In the peel strength between the thermoplastic liquid crystal polymer film and the shiny side with no roughness for increasing the peel strength to the film provided, the thermal degradation of the thermoplastic liquid crystal polymer film caused by the continuing heat treatment is significantly reflected in the peel strength. Hence the decrease in the peel strength is observed once a certain heat treatment time has passed.

As described above, under the heat treatment condition of the present invention, the difference in interface structure is eliminated (the interface structure is homogenized) between the skin layer 16 and the core layer 17 on the surface of the thermoplastic liquid crystal polymer film 2, so that the peel strength may be increased. In addition, since the heat treatment is provided under the condition in which the thermal degradation does not occur to the surface of the metal foil 3 with low roughness, the obtained laminate may have a high frequency characteristic and increased peel strength between the thermoplastic liquid crystal polymer film 2 and the metal foil 3.

Note that the heat treatment temperature Ta is set higher than the melting point Tm of the thermoplastic liquid crystal polymer film 2 because, if the heat treatment temperature Ta is lower than or equal to the melting point Tm, the effect of the disappearance of the skin layer 16 on the surface of the thermoplastic liquid crystal polymer film 2 by the heat treatment is insufficient such that the increase in the peel strength is insufficient between the thermoplastic liquid crystal polymer film 2 and the metal foil 3. If the heat treatment temperature Ta is set to 50° C. as high as or higher than the melting point Tm, the beat, treatment temperature Ta rises close to the decomposition temperature of the thermoplastic liquid crystal polymer film 2, such that the appearance of the metal-clad laminate sheet 1 could be deteriorated with, for example, stain.

Such a heat treatment provided for a heat treatment time T may control the thermal degradations of the surface of the metal foil 3 with low roughness and the thermoplastic liquid crystal polymer film 2. Thus, the obtained laminate may have a high frequency characteristic and increased peel strength between the thermoplastic liquid crystal polymer film 2 and the metal foil 3.

Note that the skin layer of the present invention is a layer confirmed by an observation with a scanning electron microscope (SEM) when a cross section of the metal-clad laminate sheet 1 is polished with a cross-section polisher and etched with a propylamine solution so that the structure of the domains is emphasized.

Moreover, the heat treatment of the present invention may control the coefficient of thermal expansion of the thermoplastic liquid crystal polymer film 2 within a specific range. For example, the heat treatment over 10 minutes is not preferable because the coefficient of thermal expansion of the thermoplastic liquid crystal polymer film 2 becomes excessively high such that the dimensional variation of the metal-clad laminate sheet 1 becomes inevitably high. Furthermore, when the heat treatment temperature Ta is higher than the melting point Tm of the thermoplastic liquid crystal polymer film 2, but not 1° C. as high as the melting point Tm, the coefficient of thermal expansion of the thermoplastic liquid crystal polymer film 2 is low such that the dimensional variation of the metal-clad laminate sheet 1 becomes inevitably high. This is not preferable.

Note that the embodiment may be modified as described below.

Figure 4:
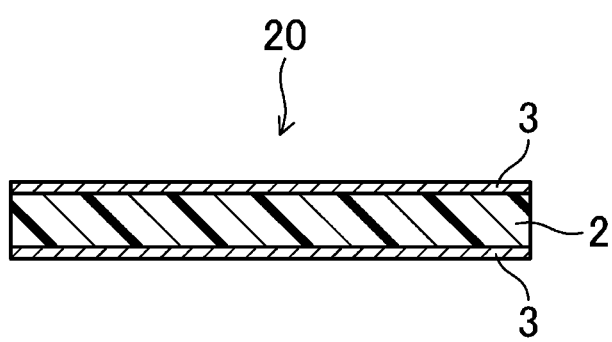
FIG. 4 is a cross-sectional view illustrating a structure of a metal-clad laminate sheet according to a modification of the present invention.

The embodiment shows as an example of the metal-clad laminate sheet 1 including the thermoplastic liquid crystal polymer film 2 and the metal foil 3 bonded on one surface of the thermoplastic liquid crystal polymer film 2. The present invention may also be applied to the metal-clad laminate sheet 1 in FIG. 4 including the thermoplastic liquid crystal polymer film 2 and the metal foil 3 bonded on each side of the thermoplastic liquid crystal polymer film 2. Specifically the present invention may be applied to a metal-clad laminate sheet including the thermoplastic liquid crystal polymer film 2 and the metal foil 3 bonded at least on one surface of the thermoplastic liquid crystal polymer film 2.

Figure 5:
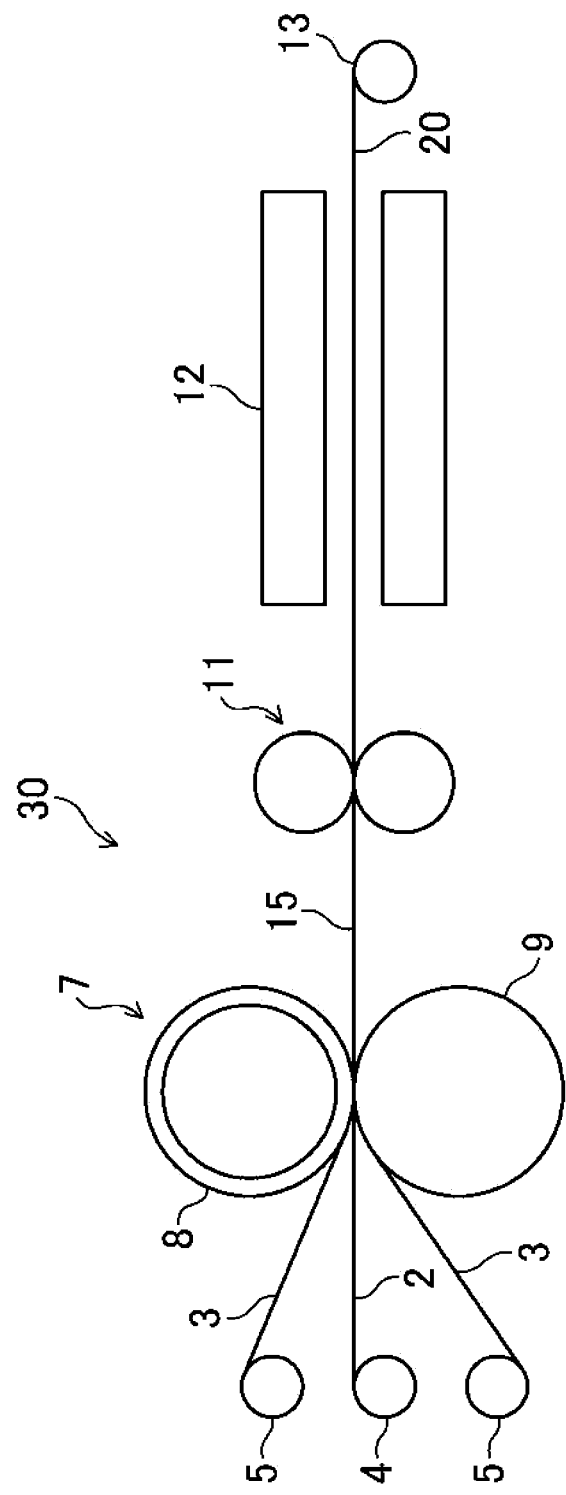
FIG. 5 is a schematic view illustrating an overall configuration of a continuous hot-press apparatus to be used in a method for manufacturing the metal-clad laminate sheet according to the modification of the present invention.

As illustrated in FIG. 5, used here a continuous hot-press apparatus 30 that is, the continuous hot-press apparatus 10 illustrated in FIG. 3 further including another delivery roll 5 loaded with another metal foil such as copper foil in a roll shape (in other words including two delivery rolls 5).

Then, similar to the case of the above embodiment, first, the thermoplastic liquid crystal polymer film 2 elongated is placed in a state of tension. On each face of the thermoplastic liquid crystal polymer film 2, the metal foil 3 elongated is laid. The thermoplastic liquid crystal polymer film 2 and the metal foil 3 are thermocompression-bonded between heating rolls 7 and laminated together so that a laminate sheet 15 is produced. Then, the obtained laminate sheet 5 is heat-treated so that a metal-clad laminate sheet 20 is produced.

Then, similar to the case of the above embodiment, the heat treatment temperature Ta is set to range between 1° C. inclusive and 50° C. exclusive higher than the melting point Tm of the thermoplastic liquid crystal polymer film 2, and the heat treatment is provided for one second to 10 minutes. As a result, the obtained metal-clad laminate sheet 20 may have a high frequency characteristic and increased peel strength between the thermoplastic liquid crystal polymer film 2 and the metal foil 3.

Figure 6:
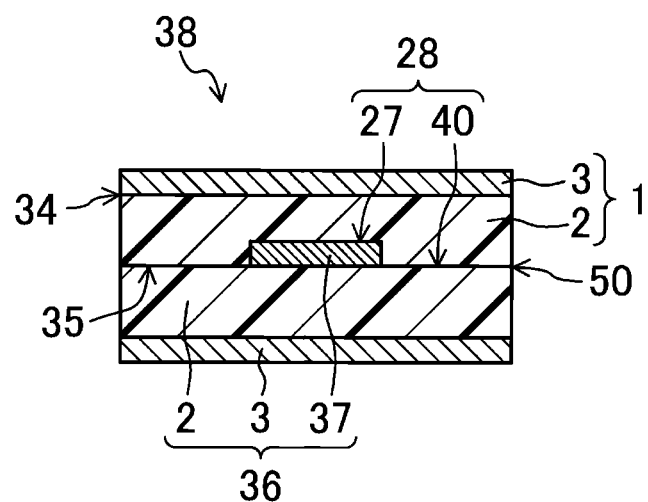
FIG. 6 is a cross-sectional view illustrating a structure of a multilayer circuit board including a single-sided metal-clad laminate sheet and a circuit board laminated together according to a modification of the present invention.

Moreover, in a similar manner, the present invention is applicable to a multilayer circuit board 38 illustrated in FIG. 6 including the single-sided metal-clad laminate sheet 1, and a circuit board 36 laminated together. The circuit board 36 includes the thermoplastic liquid crystal polymer film 2, the metal foil 3, and a circuit pattern 37.

Figure 7:
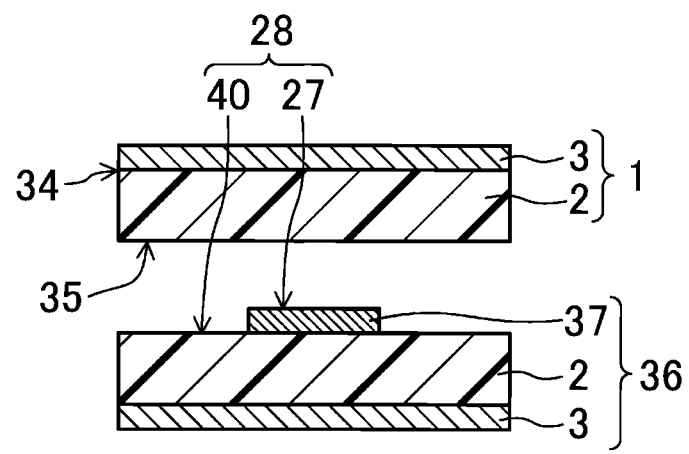
FIG. 7 is a cross-sectional view illustrating a method for manufacturing the multilayer circuit board according to the modification of the present invention.

In this case, as illustrated in FIG. 7, the single-sided metal-clad laminate sheet 1 and the circuit board 36 are laid on top of the other and laminated together via a film face 35 of the single-sided metal-clad laminate sheet 1 and a surface 28 of the circuit board 36 toward the circuit pattern 37. Here, the surface 28 includes (i) a surface 40, of the thermoplastic liquid crystal polymer film 2, across from the metal foil 3 in the circuit board 36, and (ii) a surface 27 of the circuit pattern 37 in the circuit board 36. With a vacuum batch-press machine, this laminate is heated and pressed by vacuum hot pressing so that the single-sided metal-clad laminate sheet 1 and the circuit board 36 are thermocompression-bonded together. As a result, the multilayer circuit board 38 illustrated in FIG. 6 is produced.

Then, similar to the case of the above embodiment, the heat treatment temperature Ta is set to range between 1° C. inclusive and 50° C. exclusive higher than the melting point Tm of the thermoplastic liquid crystal polymer film 2, and the heat treatment is provided for one second to 10 minutes. Hence, peel strength may be increased at an interface 34 between the thermoplastic liquid crystal polymer film 2 and the metal foil 3. In addition, peel strength may be increased at an interface 50 between (i) the thermoplastic liquid crystal polymer film 2 in the single-sided metal-clad laminate sheet 1 and (ii) the thermoplastic liquid crystal polymer film 2 and the circuit pattern 37 in the circuit board 36. At the interface 50, a film face 35 of the single-sided metal-clad laminate sheet 1 and a surface 28 of the circuit board 36 toward the circuit pattern 7 make contact with each other.

Figure 8:
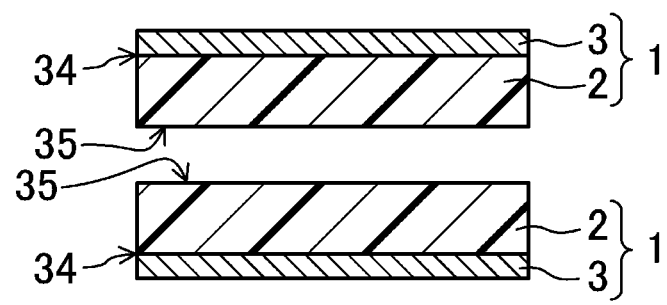
FIG. 8 is a cross-sectional view illustrating a method for manufacturing a multilayer circuit board according to a modification of the present invention.
Figure 9:
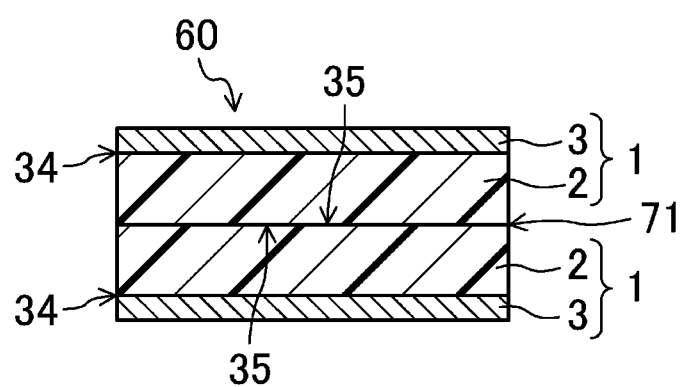
FIG. 9 is a cross-sectional view illustrating a structure of the multilayer circuit board including a single-sided metal-clad laminate sheet and a circuit board laminated together according to the modification of the present invention.

Moreover, as illustrated in FIG. 8, two single-sided metal-clad laminate sheets 1 illustrated in FIG. 1 are prepared, and laminated together via the film face 35 on each single-sided metal-clad laminate sheet 1. As to result, a multilayer circuit board 60 may be formed as illustrated in FIG. 9.

Then, also in this multilayer circuit board 60, peel strength may be increased at the interface 34 between the thermoplastic liquid crystal polymer film 2 and the metal foil 3 as seen in the above multilayer circuit board 38. In addition, peel strength may be increased at an interface 71 between layers of the thermoplastic liquid crystal polymer film 2 included in the respective single-sided metal-clad laminate sheets 1. At the interface 71, the film faces 35 of the respective single-sided metal-clad laminate sheets 1 make contact with each other.

Here, as illustrated in FIG. 8, two single-sided metal-clad laminate sheets 1 are laminated together via their respective film faces 35. This laminate is heated and pressed by vacuum hot pressing so that the two single-sided metal-clad laminate sheets 1 are thermocompression-bonded together. As a result, the multilayer circuit board 60 is formed as illustrated in FIG. 9.

Figure 10:
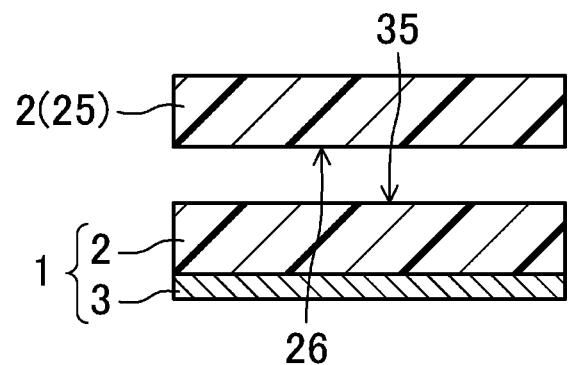
FIG. 10 is a cross-sectional view illustrating a method for manufacturing a multilayer circuit board according to a modification of the present invention.
Figure 11:
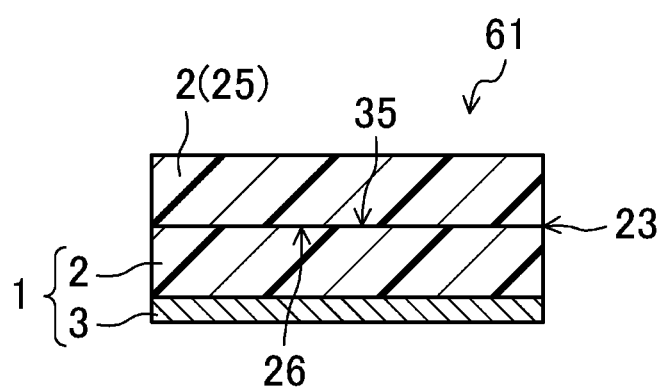
FIG. 11 is a cross-sectional view illustrating a structure of the multilayer circuit board including a single-sided metal-clad laminate sheet and a film substrate laminated together according to the modification of the present invention.

Furthermore, as illustrated in FIG. 10, a film substrate 25 made of the thermoplastic liquid crystal polymer film 2 may be used instead of the circuit board 36. Through a film face 35 of the ingle-sided metal-clad laminate sheet 1 illustrated in FIG. 11 and a film face 26 of the film substrate 25, the single-sided metal-clad laminate sheet 1 and the film substrate 25 are laminated together so that a multilayer circuit board 61 may be formed as illustrated in FIG. 11.

Then, also in this multilayer circuit board 61, peel strength may be increased at the interface 34 between the thermoplastic liquid crystal polymer film 2 and the metal foil 3 as seen in the above multilayer circuit board 38. In addition, peel strength may be increased at an interface 23 between the thermoplastic liquid crystal polymer film 2 in the single-sided metal-clad laminate sheet 1 and the thermoplastic liquid crystal polymer film 2 in the film substrate 25. At the interface 23, the film face 35 of the single-sided metal-clad laminate sheet 1 and the film face 26 of the film substrate 25 make contact with each other.

Here, as illustrated in FIG. 10, the single-sided metal-clad laminate sheet 1 and the film substrate 25 are laid on top of the other and laminated together via the film face 35 of the single-sided metal-clad laminate sheets 1 and the film face 26 of the film substrate 25. This laminate is heated and pressed by vacuum hot pressing so that the single-sided metal-clad laminate sheets 1 and the film substrate 25 are thermocompression-bonded together. As a result, a multilayer circuit board 61 is formed as illustrated in FIG. 11.

EXAMPLES

The present invention is described below based on examples. Note that the present invention shall not be limited to these examples. These examples may be modified and changed based on the intent of the present invention. Such a change and modification shall not be excluded from the scope of the invention.

Examples 1 to 10, Comparative Examples 1 to 6

<Producing Thermoplastic Liquid Crystal Polymer Film>

Thermotropic liquid crystal polyester containing a 6-hydroxy-2-naphthoic acid unit (27 mol %) and a p-hydroxybenzoic acid unit (73 mol %) was heated at 280° C. to 300° C. and kneaded with a single screw extruder. Then, the thermotropic liquid crystal polyester was extruded from an inflation die having a diameter of 40 mm and a slit distance of 0.6 mm so that thermoplastic liquid crystal polymer film having a thickness of 50 μm was obtained. This thermoplastic liquid crystal polymer film has a melting point Tm of 283° C. and a heat distortion temperature Tdef of 230° C.

Note that the melting point was obtained with a differential scanning calorimeter through an observation of a thermal behavior of the film. Specifically, the produced film was heated at a speed of 20° C./min to melt completely. Then, the melt film was rapidly cooled to 50° C. at a speed of 50° C./min. Then, when the cooled film a heated again at a speed of 20° C./min, the endothermic peak observed was determined as the melting point of the thermoplastic liquid crystal polymer film.

<Producing Metal-Clad Laminate Sheet>

Next, using a continuous hot-press apparatus, the produced thermoplastic liquid crystal polymer film and rolled copper foil having a thickness of 12 μm (Manufactured by JX Nippon Mining & Metals Corporation, Trade Name: BHYX-92F-HA, Surface Roughness: 0.9 μm) were introduced between a heat-resistant rubber roll and a heating metal roll and thermally pressed to bond together. Hence, a laminate sheet was produced.

Note that the surface roughness Rz of the copper foil was calculated through measurement of ten point average surface roughness on a roughened face in compliance with JISB0601, using a surface roughness tester (Manufactured by Mitsutoyo Corporation, Trade Name: SURF TEST SJ-201). Under a condition in which a measurement reference length was 0.8 mm, an evaluation length was 4 mm, a cutoff value was 0.8 mm, and a feed speed was 0.5 mm/sec, the surface roughness was measured 10 times with the measurement position changed to be in parallel with the rolling direction. An average value among the ten measurements was obtained.

As the heat-resistant rubber roll making contact with the thermoplastic liquid crystal polymer film, a resin-coated metal roll (Manufactured by Yuri Roll Machine Co., Ltd., Trade Name: Super Ten Apex. Resin Thickness: 1.7 cm) was used. The heat-resistant rubber roll and the heating metal roll used had a diameter of 40 cm.

A surface temperature of the heating metal roll was set to a temperature 20° C. lower (i.e., 263° C.) than the melting point of the thermoplastic liquid crystal polymer film. A pressure to be applied to the thermoplastic liquid crystal polymer film and the copper foil between the heat-resistant rubber roll and the heating metal roll was set to 120 kg/cm$^2$ in face pressure. Under this condition, the thermoplastic liquid crystal polymer film was moved along the heat-resistant rubber roll. Then, the copper foil was laid on, and temporarily bonded to, the thermoplastic liquid crystal polymer film.

<Heat Treading>

Next, winding tension was released on the production line with a nip roll. The produced laminate sheet was passed through an infrared heat treatment apparatus (Manufactured by Noritake Co., Ltd., Trade Name: Roll to Roll Far-Infrared Heating Furnace) and heat-treated. Metal-clad laminate sheets for Examples 1 to 10 and Comparative Examples 1 to 6 were produced.

Note that a heat treatment time (i.e., a time period in which any given one point of a laminate sheet passed through the heat treatment apparatus) and a heat treatment temperature in the heat treatment apparatus were set as seen in Table 6.

<Evaluating Peel Strength>

Next, a delamination test specimen having a width of 1.0 cm was produced from each of the produced metal-clad laminate sheets. A thermoplastic liquid crystal polymer film layer of the test specimen was fixed to a flat plate with double-sided adhesive tape. When the metal foil was delaminated in a 180°-peel test at a speed of 50 mm/mm in compliance with JISC5016, a strength (kN/m) was measured.

Note that in view of, for example, flex resistance, a delamination strength of 0.7 kN/m or higher was required. Hence the peel strength was determined to be good when the strength was 0.7 kN/m or higher. Table 6 shows the results.

<Meaning Insertion Loss>

Next an insertion loss was measured for each of the produced metal-clad laminate sheets. More specifically, the insertion loss was measured with a microwave network analyzer (Manufactured by Agilent, Model: 8722ES) and a probe (Manufactured by Cascade Microtech, Inc., Model: ACP-250) at a frequency of 40 GHz.

Note that in view of high frequency characteristics, an insertion loss of –0.8 or below was determined to be good. An insertion loss of –0.8 or above was determined to be poor. Table 6 shows the results.

Examples 11 to 13, Comparative Examples 7 to 9

The copper foil used had a thickness of 12 μm (Manufactured by Mitsui Mining & Smelting Co., Ltd., Trade Name: TQ-M7-VSP, Surface Roughness: 1.1 μm). Other than heat treatments provided at the temperatures for the time periods shown in Table 7 metal-clad laminate sheets were produced in a similar manner as the above Example 1. Then, as seen in the above Example 1, peel strength was evaluated and insertion loss was measured. Table 7 shows the results.

Examples 14 to 16, Comparative Examples 10 to 12

The copper foil used had a thickness of 12 μm (JX Nippon Mining & Metals Corporation, Trade Name: BHYX-92F-HA, Surface Roughness of Shiny Side: 0.5 μm). Other than heat treatments provided at the temperatures for the time periods shown in Table 8, metal-clad laminate sheets were produced in a similar manner as the above Example 1. Then, as seen in the above Example 1, peel strength was evaluated and insertion loss was measured. Table 8 shows the results.

Examples 17 to 19, Comparative Examples 13 and 14

<Producing Thermoplastic Liquid Crystal Polymer Film>

Thermotropic liquid crystal polyester containing a 6-hydroxy-2-naphthoic acid unit (27 mol %) and a p-hydroxybenzoic acid unit (73 mol %) was heated at 280° C. to 300° C. and kneaded with a single screw extruder. Then, the thermotropic liquid crystal polyester was extruded from an inflation die having a diameter of 40 mm and a slit distance of 0.6 mm so that thermoplastic liquid crystal polymer film having a thickness of 50 μm was obtained. This thermoplastic liquid crystal polymer film has a melting point Tm of 283° C. and a heat distortion temperature Tdef of 230° C.

A temperature of the surface of this thermoplastic liquid crystal polymer film was raised to 260° C. in a hot air dryer with hot air having a temperature of 260° C. under a nitrogen atmosphere. The thermoplastic liquid crystal polymer film as heat-treated at this temperature for two hours. Then, the temperature was raised to 280° C. in 30 minutes. After that, the thermoplastic liquid crystal polymer film was heat-treated for two hours. After the heat treatment, the temperature was lowered to 200° C. at a speed of 20° C./min. Then the thermoplastic liquid crystal polymer film was taken out of the hot air dryer. The obtained film had a melting point of 315° C.

Then, the copper foil used had a thickness of 12 μm (JX Nippon Mining & Metals Corporation, Trade Name: BHYX-92F-HA, Surface Roughness: 0.9 μm). Other than heat treatments provided at the temperatures for the time periods shown in Table 9, metal-clad laminate sheets were produced in a similar manner as the above Example 1. Then, as seen in the above Example 1, peel strength was evaluated and insertion loss was measured. Table 9 shows the results.

Examples 20 to 26, Comparative Examples 15 to 18

Other than the use of a hot air circulation furnace (Manufactured by Yamato Scientific Co., Ltd. Trade Name: Inert Oven DN411I) as a heat treatment unit instead of the infrared heat treatment apparatus, and heat treatments provided at the temperatures for the time periods shown in Table 10, metal-clad laminate sheets were produced in a similar manner as the above Example 1. Then, as seen in the above Example 1, peel strength was evaluated and insertion loss was measured. Table 10 shows the results.

Examples 27 to 29, Comparative Examples 19 and 20

Other than the use of the hot air circulation furnace (Manufactured by Yamato Scientific Co., Ltd., Trade Name: Inert Oven DN411I) as a heat treatment unit instead of the infrared heat treatment apparatus, and heat treatments provided at the temperatures for the time periods shown in Table 11, metal-clad laminate sheets were produced in a similar manner as the above Example 11. Then, as seen in the above Example 1, peel strength was evaluated and insertion loss was measured. Table 11 shows the results.

TABLE 6

| | Film Melting Point Tm (° C.) | Heat Treatment Temperature Ta (° C.) | Ta – Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 1 | 283 | 300 | 17 | 0.15 | 0.9 | 1.05 | –0.62 |
| Example 2 | 283 | 300 | 17 | 1 | 0.9 | 1.3 | –0.62 |
| Example 3 | 283 | 300 | 17 | 5 | 0.9 | 0.8 | –0.62 |
| Example 4 | 283 | 290 | 7 | 0.15 | 0.9 | 1.05 | –0.62 |
| Example 5 | 283 | 280 | 7 | 2 | 0.9 | 1.1 | –0.62 |
| Example 6 | 283 | 290 | 7 | 5 | 0.9 | 0.75 | –0.62 |
| Example 7 | 283 | 285 | 2 | 0.15 | 0.9 | 0.8 | –0.62 |
| Example 8 | 283 | 285 | 2 | 0.5 | 0.9 | 1.05 | –0.62 |

TABLE 6-continued

|  | Film Melting Point Tm (° C.) | Heat Treatment Temperature Ta (° C.) | Ta − Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 9 | 283 | 285 | 2 | 2 | 0.9 | 1.1 | −0.62 |
| Example 10 | 283 | 285 | 2 | 5 | 0.9 | 0.8 | −0.62 |
| Comparative Example 1 | 283 | — | — | 0 | 0.9 | 0.325 | −0.62 |
| Comparative Example 2 | 283 | 300 | 17 | 15 | 0.9 | 0.6 | −0.62 |
| Comparative Example 3 | 283 | 290 | 7 | 15 | 0.9 | 0.6 | −0.62 |
| Comparative Example 4 | 283 | 290 | 7 | 30 | 0.9 | 0.6 | −0.62 |
| Comparative Example 5 | 283 | 285 | 2 | 15 | 0.9 | 0.6 | −0.62 |
| Comparative Example 6 | 283 | 285 | 2 | 30 | 0.9 | 0.6 | −0.62 |

TABLE 7

|  | Film Melting Point Tm (° C.) | Heat Treatment Temperature Ta (° C.) | Ta − Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 11 | 283 | 290 | 7 | 0.5 | 1.1 | 1.25 | −0.77 |
| Example 12 | 283 | 290 | 7 | 1 | 1.1 | 1.55 | −0.77 |
| Example 13 | 283 | 290 | 7 | 5 | 1.1 | 0.75 | −0.77 |
| Comparative Example 7 | 283 | — | — | 0 | 1.1 | 0.4 | −0.77 |
| Comparative Example 8 | 283 | 290 | 7 | 15 | 1.1 | 0.55 | −0.77 |
| Comparative Example 9 | 283 | 290 | 7 | 30 | 1.1 | 0.55 | −0.77 |

TABLE 8

|  | Film Melting Point Tm (° C.) | Heat Treatment Temperature Ta (° C.) | Ta − Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 14 | 283 | 290 | 7 | 0.15 | 0.5 | 0.9 | −0.45 |
| Example 15 | 283 | 290 | 7 | 1 | 0.5 | 1 | −0.45 |
| Example 16 | 283 | 290 | 7 | 5 | 0.5 | 0.95 | −0.45 |
| Comparative Example 10 | 283 | — | — | 0 | 0.5 | 0.2 | −0.45 |
| Comparative Example 11 | 283 | 290 | 7 | 15 | 0.5 | 0.6 | −0.45 |
| Comparative Example 12 | 283 | 290 | 7 | 30 | 0.5 | 0.6 | −0.45 |

TABLE 9

|  | Film Melting Point Tm (° C.) | Heat Treatment Temperature Ta (° C.) | Ta − Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 17 | 315 | 320 | 5 | 0.15 | 0.9 | 1.15 | −0.62 |
| Example 18 | 315 | 320 | 5 | 1 | 0.9 | 1.4 | −0.62 |
| Example 19 | 315 | 320 | 5 | 5 | 0.9 | 0.8 | −0.62 |
| Comparative Example 13 | 315 | — | — | 0 | 0.9 | 0.65 | −0.62 |
| Comparative Example 14 | 315 | 320 | 5 | 15 | 0.9 | 0.6 | −0.62 |

TABLE 10

| | Film Melting Point Tm (° C.) | Heat Treatment Temperate Ta (° C.) | Ta − Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 20 | 283 | 300 | 17 | 0.5 | 0.9 | 1.05 | −0.62 |
| Example 21 | 283 | 300 | 17 | 1 | 0.9 | 1.3 | −0.62 |
| Example 22 | 283 | 300 | 17 | 5 | 0.9 | 0.8 | −0.62 |
| Example 23 | 283 | 290 | 7 | 2 | 0.9 | 1 | −0.62 |
| Example 24 | 283 | 290 | 7 | 5 | 0.9 | 0.75 | −0.62 |
| Example 25 | 283 | 285 | 2 | 2 | 0.9 | 0.7 | −0.62 |
| Example 26 | 283 | 285 | 2 | 5 | 0.9 | 0.8 | −0.62 |
| Comparative Example 15 | 283 | 300 | 17 | 15 | 0.9 | 0.65 | −0.62 |
| Comparative Example 16 | 283 | 290 | 7 | 30 | 0.9 | 0.6 | −0.62 |
| Comparative Example 17 | 283 | 285 | 2 | 15 | 0.9 | 0.45 | −0.62 |
| Comparative Example 18 | 283 | 285 | 2 | 30 | 0.9 | 0.5 | −0.62 |

TABLE 11

| | Film Melting Point Tm (° C.) | Heat Treatment Temperature Ta (° C.) | Ta − Tm (° C.) | Heat Treatment Time (min) | Surface Roughness of Copper Foil (μm) | Peel Strength between Copper Foil and Film (kN/m) | Insertion Loss (db/cm) |
|---|---|---|---|---|---|---|---|
| Example 27 | 283 | 290 | 7 | 0.5 | 1.1 | 1.25 | −0.77 |
| Example 28 | 283 | 290 | 7 | 1 | 1.1 | 1.25 | −0.77 |
| Example 29 | 283 | 290 | 7 | 5 | 1.1 | 0.75 | −0.77 |
| Comparative Example 19 | 283 | 290 | 7 | 15 | 1.1 | 0.55 | −0.77 |
| Comparative Example 20 | 283 | 290 | 7 | 30 | 1.1 | 0.55 | −0.77 |

As Tables 6 to 11 show, the heat treatment temperature Ta was set to range between 1° C. inclusive and 50° C. exclusive higher than the melting point Tm of the thermoplastic liquid crystal polymer film and the heat treatment was provided for one second to 10 minutes in Examples 1 to 29. Examples 1 to 29 show that the metal-clad laminate sheets obtained have a high frequency characteristic and good peel strength between a thermoplastic liquid crystal polymer film and metal foil.

Meanwhile, in Comparative Examples 1 to 20, either the heat treatment was not provided or was provided for an excessive time period. Compared with Examples 1 to 29, Comparative Examples 1 to 20 show poor peel strength between a thermoplastic liquid crystal polymer film and metal foil.

Examples 30 to 33, Comparative Example 21

<Producing Thermoplastic Liquid Crystal Polymer Film>

Thermotropic liquid crystal polyester containing a 6-hydroxy-2-naphthoic acid unit (27 mol %) and a p-hydroxybenzoic acid unit (73 mol %) was heated at 280° C. to 300° C. and kneaded with a single screw extruder. Then, the thermotropic liquid crystal polyester was extruded from an inflation die having a diameter of 40 mm and a slit distance of 0.6 mm so that thermoplastic liquid crystal polymer film having a thickness of 50 μm was obtained. This thermoplastic liquid crystal polymer film has a melting point Tm of 282° C. and a heat distortion temperature Tdef of 230° C.

Other than heat treatments provided at the temperatures for the time periods shown in Table 12, metal-clad laminate sheets were produced in a similar manner as the above Example 1. Then, as seen in the above Example 1, peel strength was evaluated and insertion loss was measured. Table 12 shows the results.

<Measuring Coefficient of Thermal Expansion>

Using a thermal mechanical analyzer (TMA), a tensile force of 1 g was applied to both ends of the thermoplastic liquid crystal polymer film having a width of 5 mm and a length of 20 mm. A temperature of the film was raised from a room temperature to 200° C. at a speed of 5° C./min, and a coefficient of thermal expansion of the film was measured based on a variation in film length between 30° C. and 150° C. Table 12 shows the results.

<Measuring Thickness of Skin Layer>

Next, each of the produced metal-clad laminate sheets was embedded in acrylic resin. The cross section of the metal-clad laminate sheet was polished with a cross-section polisher and etched with a propylamine solution so that the structure of the domains was emphasized. The cross section was then observed with a scanning electron microscope (SEM). An average value of thicknesses of any given five portions of a skin layer was calculated within an area of 30μ×30 μm observed in a cross-section image.

<Evaluating Dimensional Stability>

Next, for the produced copper-clad laminate sheets, a rate of variation in dimension (%) in the MD and TD directions was measured in compliance with IPC-TM-6502.2.4. An average value of the rates of variation was determined as a dimensional variation. When the dimensional aviation is not over ±0.1%, the dimensional stability is good. Table 12 shows the results.

TABLE 12

|  | Film Melting Point Tm (° C.) | Heat Treatment Temperature Ta(° C.) | Ta − Tm (° C.) | Heat Treatment Time (min) | Surface Roughness of Copper Foil (μm) |
|---|---|---|---|---|---|
| Example 30 | 282 | 300 | 18 | 0.15 | 0.9 |
| Example 31 | 282 | 300 | 18 | 1 | 0.9 |
| Example 32 | 282 | 300 | 18 | 2 | 0.9 |
| Example 33 | 282 | 300 | 18 | 3 | 0.9 |
| Comparative Example 21 | 282 | 270 | −12 | 1 | 0.9 |

|  | Coefficient of Thermal Expansion of Film (ppm/° C.) | Peel Strength between Copper Foil and Film (kN/m) | Insertion Loss (db/cm) | Thickness of Skin layer (μm) | Dimensional Variation (%) |
|---|---|---|---|---|---|
| Example 30 | 10 | 1.0 | −0.62 | Equal to Surface Roughness of Copper Foil or Smaller | 0.1 |
| Example 31 | 18 | 1.0 | −0.62 | Equal to Surface Roughness of Copper Foil or Smaller | 0.03 |
| Example 32 | 21 | 1.0 | −0.62 | Equal to Surface Roughness of Copper Foil or Smaller | 0.05 |
| Example 33 | 30 | 1.0 | −0.62 | Equal to Surface Roughness of Copper Foil or Smaller | 0.1 |
| Comparative Example 21 | −7 | 0.4 | −0.62 | 4 | 0.15 |

As Table 12 shows, the heat treatment temperature Ta was set to range between 1° C. inclusive and 50° C. exclusive higher than the melting point Tm of the thermoplastic liquid crystal polymer film and the heat treatment was provided for one second to 10 minutes in Examples 30 to 33. Examples 30 to 33 show that the metal-clad laminate sheets obtained have a high frequency characteristic and increased peel strength between a thermoplastic liquid crystal polymer film and metal foil.

Figure 12:
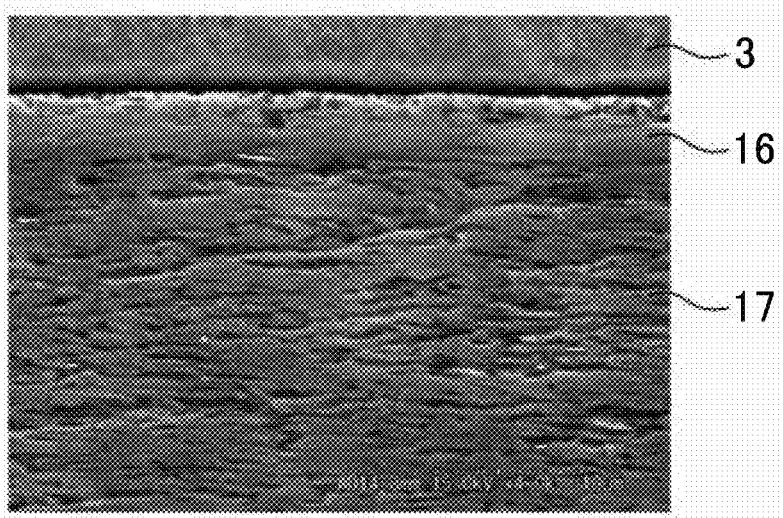
FIG. 12 is a scanning electron micrograph (SEM) of a metal-clad laminate sheet (before heat treatment) according to Example 30.
Figure 13:
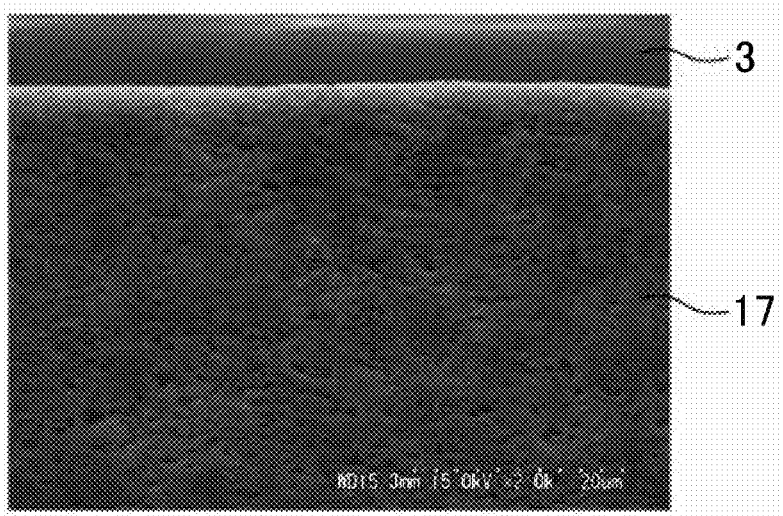
FIG. 13 is a scanning electron micrograph (SEM) of the metal-clad laminate sheet (after heat treatment) according to Example 30.

More specifically, in Example 30 for example, FIG. 12 shows the skin layer 16 on the surface of the core layer 17 of the metal-clad laminate sheet before heat treatment. However, in FIG. 13, the skin layer 16 has disappeared from the metal-clad laminate sheet after heat treatment, showing an increase in the peel strength between the metal foil (copper foil) 3 and the core layer 17. Moreover, also in Examples 31 to 33, the skin layer has disappeared as has done so in Example 30, showing an increase in peel strength between a metal foil (copper foil) and a core layer.

Meanwhile, in Comparative Example 21, the heat treatment was provided at a temperature lower than the melting point of the there oplastic liquid crystal polymer film, such that the skin layer has not disappeared. Compared with Examples 30 to 33, Comparative Example 21 shows poor peel strength between the thermoplastic liquid crystal polymer film and the metal foil.

Compared with Comparative Example 21, Examples 30 to 33 show a dimensional variation of not over ±0.1%, showing good dimensional stability.

Examples 34 to 43, Comparative Examples 22 to 27

<Producing Thermoplastic Liquid Crystal Polymer Film>

Thermotropic liquid crystal polyester containing a 6-hydroxy-2-naphthoic acid unit (27 mol %) and a p-hydroxybenzoic acid unit (73 mol %) was heated at 280° C. to 300° C. and kneaded with a single screw extruder. Then, the thermotropic liquid crystal polyester was extruded from an inflation die having a diameter of 40 mm and a slit distance of 0.6 mm so that a thermoplastic liquid crystal polymer film 2 having a thickness of 50 μm was obtained. This thermoplastic liquid crystal polymer film has a melting point Tm of 283° C. and a heat distortion temperature Tdef of 230° C.

Note that the melting point was obtained with a differential scanning calorimeter through an observation of a thermal behavior of the film. Specifically, the produced film was heated at a speed of 20° C./min to melt completely. Then, the melt film was rapidly cooled to 50° C. at a speed of 50° C./min. Then, when the cooled film was heated again at a speed of 20° C./min, the endothermic peak observed was determined as the melting point of the thermoplastic liquid crystal polymer film.

<Producing Single-Sided Metal-Clad Laminate Sheet>

Next using a continuous hot-press apparatus, the produced thermoplastic liquid crystal polymer film and, as the metal foil 3, rolled copper foil having a thickness of 12 μm (Manufactured by JX Nippon Mining & Metals Corporation, Trade Name: BHYX-92F-HA, Surface Roughness: 0.9 μm) were introduced between a heat-resistant rubber roll and a heating metal roll, and thermally pressed to bond together. Hence, a laminate sheet was produced.

Note that the surface roughness Rz of the copper foil was calculated through measurement of ten point average surface roughness on a roughened face in compliance with JISB0601, using a surface roughness tester (Manufactured by Mitsutoyo Corporation, Trade Name: SURF TEST SJ-201). Under a condition in which a measurement reference length was 0.8 mm, an evaluation length was 4 mm, a cutoff value was 0.8 mm, and a feed speed was 0.5 mm/sec, the surface roughness was measured 10 times with the measurement position changed to be in parallel with the rolling direction. An average value among the ten measurements was obtained.

As the heat-resistant rubber roll making contact with the thermoplastic liquid crystal polymer film, a resin-coated metal roll (Manufactured by Yuri Roll Machine Co. Ltd., Trade Name: Super Ten Apex. Resin Thickness: 1.7 cm) was used. The heat-resistant rubber roll and the heating metal roll used had a diameter of 40 cm.

A surface temperature of the heating metal roll was set to a temperature 20° C. lower (i.e., 263° C.) than the melting point of the thermoplastic liquid crystal polymer film. A pressure to be applied to the thermoplastic liquid crystal polymer film and the copper foil between the heat-resistant rubber roll and the heating metal roll was set to 120 kg/cm$^2$ in face pressure. Under this condition, the thermoplastic liquid crystal polymer film was moved along the heat-resistant rubber roll. Then, the copper foil was laid on, and temporarily bonded to, the thermoplastic liquid crystal polymer film.

<Heat Treading>

Next, winding tension was released on the production line with a nip roll. The produced laminate sheet was passed through an infrared heat treatment apparatus (Manufactured by Noritake Co Ltd., Trade Name: Roll to Roll Far-Infrared Heating Furnace) as a heat treatment unit, and heat-treated. Single-sided metal-clad laminate sheets for Examples 34 to 43 and Comparative Examples 22 to 27 were produced.

Note that a heat treatment time (i.e., a time period in which any given cane point of a laminate sheet passed through the heat treatment apparatus) and a heat treatment temperature in the heat treatment apparatus were set as seen in Table 13.

<Producing Circuit Board>

Next, the circuit board 36 produced. More specifically, thermotropic liquid crystal polyester containing a 6-hydroxy-2-naphthoic acid unit (27 mol %) and a p-hydroxybenzoic acid unit (73 mol %) was heated at 280° C. to 300° C. and kneaded with a single screw extruder. Then, the thermotropic liquid crystal polyester was extruded from an inflation die having a diameter of 40 mm and a slit distance of 0.6 mm so that thermoplastic liquid crystal polymer film having a thickness of 50 μm was obtained. This thermoplastic liquid crystal polymer film has a melting point Tm of 283° C. and a heat distortion temperature Tdef of 230° C.

A temperature of the surface of this thermoplastic liquid crystal polymer film was raised to 260° C. in a hot air dryer with hot air having a temperature of 260° C. under a nitrogen atmosphere. The thermoplastic liquid crystal polymer film was heat-treated at this temperature for two hours. Then, the temperature was raised to 280° C. in 30 minutes. After that, the thermoplastic liquid crystal polymer film was heat-treated for two hours. After the heat treatment, the temperature was lowered to 200° C. at a speed of 20° C./min. Then the thermoplastic liquid crystal polymer film was taken out of the hot air dryer. The obtained film had a melting point of 315° C.

Rolled copper foil having a thickness of 12 μm (Manufactured by JX Nippon Mining & Metals Corporation, Trade Name: BHYX-92F-HA Surface Roughness: 0.9 μm) was pressed on, and attached to, each side of this film with vacuum batch-press machine (Manufactured by Kitagawa Seiki Co., Ltd. Trade Name: VH2-1600) at 4 Torr, at 300° C., for 10 minutes. Hence, a double-sided metal-clad laminate sheet was produced. Then, the circuit pattern 37 was patterned on one face of the copper foil with a photomask so that the circuit board 36 was produced.

<Producing Multilayer Circuit Board>

Next, the multilayer circuit boards 38, 60, and 61 were produced as respectively shown in FIGS. 6, 9, and 11.

More specifically, as illustrated in FIG. 7, the single-sided metal-clad laminate sheet 1 and the circuit board 36 were laid on top of the other and laminated together via (i) the film face 35 of the single-sided metal-clad laminate sheet 1, (ii) the surface 40, of the thermoplastic liquid crystal polymer film 2, across from the metal foil 3 in the circuit board 36, and (iii) the surface 27 of the circuit pattern 37 in the circuit board 36. With a vacuum batch-press machine (Manufactured by Kitagawa Seiki Co., Ltd. Trade Name: VH2-1600), this laminate was heated and pressed for 15 minutes (under the following condition: at a pressure of 4 Torr, at a temperature of 290° C., and at a pressure of 1.5 Mpa) by vacuum hot pressing so that the single-sided metal-clad laminate sheet 1 and the circuit board 36 were thermocompression-bonded together. As a result, the multilayer circuit board 38 was produced as illustrated in FIG. 6.

Moreover, as illustrated in FIG. 8, two single-sided metal-clad laminate sheets 1 were laminated together via the film faces 35 of their respective single-sided metal-clad laminate sheets 1. With a vacuum batch-press machine (Manufactured by Kitagawa Seiki Co., Ltd. Trade Name: VH2-1600), this laminate was heated and pressed for 15 minutes (under the following condition: at a pressure of 4 Torr, at a temperature of 290° C., and at a pressure of 1.5 Mpa) by vacuum hot pressing so that the two single-sided metal-clad laminate sheets 1 were thermocompression-bonded together. As a result, the multilayer circuit board 60 was produced as illustrated in FIG. 9.

Moreover, as the film substrate 25 illustrated in FIG. 10, the thermoplastic liquid crystal polymer film 2 included in the above single-sided metal-clad laminate sheet 1 was prepared. The single-sided metal-clad laminate sheet 1 and the film substrate 25 were laid on top of the other and laminated together via (i) the film face 35 of the single-sided metal-clad laminate sheet 1, and (ii) the film face 26 of the film substrate 25. With a vacuum batch-press machine (Manufactured by Kitagawa Seiki Co., Ltd. Trade Name: VH2-1600), this laminate was heated and pressed for 15 minutes (under the following condition: at a pressure of 4 Torr, at a temperature of 290° C., and at a pressure of 1.5 Mpa) by vacuum hot pressing so that the single-sided metal-clad laminate sheet 1 and the film substrate 25 were thermocompression-bonded together. As a result, the multilayer circuit board 61 was produced as illustrated in FIG. 11.

<Evaluating Peel Strength>

Next, a delamination test specimen having a width of 1.0 cm was produced from the produced single-sided metal-clad laminate sheet 1. The test specimen was fixed to a flat plate with double-sided adhesive tape. Next, when the metal foil (the copper foil) 3 was delaminated in a 180°-peel test at, a speed of 50 mm/min in compliance with JISC5016, a strength (kN/m) was measured for the interface 34 between the thermoplastic liquid crystal polymer film 2 and the metal foil 3 in the single-sided metal-clad laminate sheet 1.

In a similar manner, a delamination test specimen having a width of 1.0 cm was produced from the multilayer circuit board 38. The test specimen was fixed to a flat plate with double-sided adhesive tape. When the single-sided metal-clad laminate sheet 1 was delaminated in a 180°-peel test at a speed of 50 mm/min in compliance with JISC5016, a strength (kN/m) was measured for the interface 50 between the thermoplastic liquid crystal polymer film 2 and the circuit pattern 37 of the circuit board 36. Note that the peel strength was separately measured (i) between the film face 35 of the single-sided metal-clad laminate sheet 1 and the surface 40, of the thermoplastic liquid crystal polymer film 2, across from the metal foil 3 in the circuit board 36, and (ii) between the film face 35 of the single-sided metal-clad laminate sheet 1 and the surface 27 of the circuit pattern 37 in the circuit board 36.

Moreover, in a similar manner, a delamination test specimen having a width of 1.0 cm was produced from the multilayer circuit boards 60 and 61. Each test specimen was fixed to a flat plate with double-sided adhesive tape. Then, when the thermoplastic liquid crystal polymer film 2 was delaminated in a 180°-peel test at a speed of 50 mm/min in compliance with JISC5016, a strength (kN/m) was measured for (i) an interface 71 between the thermoplastic liquid crystal polymer films 2 of the respective single-sided metal-clad laminate sheets 1 for the multilayer circuit board 60, and (ii) the interface 23 between the thermoplastic liquid crystal polymer film 2 in the single-sided metal-clad laminate sheet 1 and the thermoplastic liquid crystal polymer film 2 of the film substrate 25 for the multilayer circuit board 61.

Note that in view of, for example, flex resistance, a delamination strength of 0.7 kN/m or higher was required. Hence the peel strength was determined to be good when the strength was 0.7 kN/m or higher for each peel strength evaluation. Table 13 shows the results.

<Measuring Insertion Loss>

Next an insertion loss as measured for each of the single-sided metal-clad laminate sheets 1. More specifically, the insertion loss was measured with a microwave network analyzer (Manufactured by Agilent, Model: 8722ES) and a probe (Manufactured by Cascade Microtech, Inc., Model: ACP-250) at a frequency of 40 GHz.

Note that in view of high frequency characteristics, an insertion loss of −0.8 or below was determined to be good. An insertion loss of −0.8 or above was determined to be poor. Table 13 shows the results.

Examples 44 to 46, Comparative Examples 28 to 30

The copper foil used had a thickness of 12 μm (Manufactured by Mitsui Mining & Smelting Co., Ltd. Trade Name: TQ-M7-VSP, Surface Roughness: 1.1 μm). Other than heat treatments provided at the temperatures for the time periods shown in Table 14, single-sided metal-clad laminate sheets and multilayer circuit boards were produced in a similar manner as the above Example 1. Then, as seen in the above Example 1, peel strength was evaluated and insertion loss was measured. Table 14 shows the results.

Examples 47 to 49, Comparative Examples 31 to 33

The copper foil used had a thickness of 12 μm (JX Nippon Mining Metals Corporation, Trade Name: BHYX-92F-HA, Surface Roughness of Shiny Side: 0.5 μm). Other than heat treatments provided at the temperatures for the time periods shown in Table 15, single-sided metal-clad laminate sheet and multilayer circuit board were produced in a similar manner as the above Example 1. Then, as seen in the above Example 1, peel strength was evaluated and insertion loss was measured. Table 15 shows the results.

Examples 50 to 52, Comparative Examples 34 to 36

<Producing Thermoplastic Liquid Crystal Polymer Film>

Thermotropic liquid crystal polyester containing a 6-hydroxy-2-naphthoic acid unit (27 mol %) and a p-hydroxybenzoic acid unit (73 mol %) was heated at 280° C. to 300° C. and kneaded with a single screw extruder. Then, the thermotropic liquid crystal polyester % was extruded from an inflation die having a diameter of 40 mm and a slit distance of 0.6 mm so that thermoplastic liquid crystal polymer film having a thickness of 50 μm was obtained. This thermoplastic liquid crystal polymer film has a melting point Tm of 283° C. and a heat distortion temperature Tdef of 230° C.

A temperature of the surface of this thermoplastic liquid crystal polymer film was raised to 260° C. in a hot air dryer with hot air having a temperature of 260° C. under a nitrogen atmosphere. The thermoplastic liquid crystal polymer film was heat-treated at this temperature for two hours. Then, the temperature was raised to 280° C. in 30 minutes. After that, the thermoplastic liquid crystal polymer film was heat-treated for two hours. After the heat treatment, the temperature was lowered to 200° C. at a speed of 20° C./min. Then the thermoplastic liquid crystal polymer film was taken out of the hot air dryer. The obtained film had a melting point of 315° C.

Then, the copper foil having a thickness of 12 μm (JX Nippon Mining & Metals Corporation, Trade Name: BHYX-92F-HA, Surface Roughness: 0.9 μm) was used. Peel strength was evaluated and insertion loss was measured as seen in the above Example 1, other than producing single-sided metal-clad laminate sheets through heat treatments provided at the temperatures for the time periods shown in Table 16, and setting a temperature to 305° C. for thermocompression bonding for laminating each of the single-sided metal-clad laminate sheets. Table 16 shows the results.

Examples 53 to 59, Comparative Examples 37 to 40

Single-sided metal-clad laminate sheets and multilayer circuit boards were produced in a similar manner as described in the above Example 1, other than the use of a hot air circulation furnace (Manufactured by Yamato Scientific Co., Ltd., Trade Name: Inert Oven DN411I) as a heat treatment unit instead of the infrared heat treatment apparatus, and heat treatments provided at the temperatures for the time periods shown in Table 17. Then, as seen in the above Example 1, peel strength was evaluated and insertion loss was measured. Table 17 shows the results.

TABLE 13

| | Film Melting Point Tm (° C.) | Heat Treatment Temperature Ta (° C.) | Ta − Tm (° C.) | Heat Treatment Time (min) | Surface Roughness of Copper Foil (μm) | Interface 34: Peel Strength between Copper Foil and Film (kN/m) |
|---|---|---|---|---|---|---|
| Example 34 | 283 | 300 | 17 | 0.15 | 0.9 | 1.05 |
| Example 35 | 283 | 300 | 17 | 1 | 0.9 | 1.3 |
| Example 36 | 283 | 300 | 17 | 5 | 0.9 | 0.8 |
| Example 37 | 283 | 290 | 7 | 0.15 | 0.9 | 1.05 |
| Example 38 | 283 | 290 | 7 | 2 | 0.9 | 1.1 |
| Example 39 | 283 | 290 | 7 | 5 | 0.9 | 0.75 |
| Example 40 | 283 | 285 | 2 | 0.15 | 0.9 | 0.8 |
| Example 41 | 283 | 285 | 2 | 0.5 | 0.9 | 1.05 |
| Example 42 | 283 | 285 | 2 | 2 | 0.9 | 1.1 |
| Example 43 | 283 | 285 | 2 | 5 | 0.9 | 0.8 |
| Comparative Example 22 | 283 | — | — | 0 | 0.9 | 0.325 |
| Comparative Example 23 | 283 | 300 | 17 | 15 | 0.9 | 0.6 |
| Comparative Example 24 | 283 | 290 | 7 | 15 | 0.9 | 0.6 |
| Comparative Example 25 | 283 | 290 | 7 | 30 | 0.9 | 0.6 |
| Comparative Example 26 | 283 | 285 | 2 | 15 | 0.9 | 0.6 |
| Comparative Example 27 | 283 | 285 | 2 | 30 | 0.9 | 0.6 |

| | Insertion Loss (db/cm) | Peel Strength in Multilayer Circuit Board(kN/m) | | | |
|---|---|---|---|---|---|
| | | Interface 50: Peel Strength between Film Face 35 and Surface 27 of Circuit Pattern 37 | Interface 50: Peel Strength between Film Face 35 and Surface 40 across from Metal Foil 3 | Interface 71: Peel Strength between Films | Interface 23: Peel Strength between Films |
| Example 34 | −0.62 | 0.9 | 1.1 | 1.3 | 1.1 |
| Example 35 | −0.62 | 0.7 | 1.1 | 1.3 | 1.0 |
| Example 36 | −0.62 | 0.7 | 0.9 | 1.1 | 1.0 |
| Example 37 | −0.62 | 0.9 | 1.1 | 1.2 | 1.1 |
| Example 38 | −0.62 | 0.8 | 1.1 | 1.2 | 1.0 |
| Example 39 | −0.62 | 0.7 | 0.9 | 1.0 | 1.1 |
| Example 40 | −0.62 | 0.9 | 1.2 | 1.2 | 1.1 |
| Example 41 | −0.62 | 0.8 | 1.1 | 1.2 | 1.0 |
| Example 42 | −0.62 | 0.7 | 1.1 | 1.2 | 1.1 |
| Example 43 | −0.62 | 0.7 | 1.0 | 1.1 | 1.0 |
| Comparative Example 22 | −0.62 | 0.4 | 0.3 | 0.4 | 0.5 |
| Comparative Example 23 | −0.62 | 1.0 | 0.5 | 0.6 | 0.6 |
| Comparative Example 24 | −0.62 | 1.0 | 0.6 | 0.7 | 0.7 |
| Comparative Example 25 | −0.62 | 1.0 | 0.5 | 0.5 | 0.6 |
| Comparative Example 26 | −0.62 | 0.9 | 0.6 | 0.7 | 0.7 |
| Comparative Example 27 | −0.62 | 0.9 | 0.6 | 0.6 | 0.6 |

TABLE 14

| | Film Melting Point Tm (° C.) | Heat Treatment Temperature Ta(° C.) | Ta − Tm (° C.) | Heat Treatment Time (min) | Surface Roughness of Copper Foil (μm) | Interface 34: Peel Strength between Copper Foil and Film (kN/m) |
|---|---|---|---|---|---|---|
| Example 44 | 283 | 290 | 7 | 0.15 | 1.1 | 1.25 |
| Example 45 | 283 | 290 | 7 | 1 | 1.1 | 1.55 |
| Example 46 | 283 | 290 | 7 | 5 | 1.1 | 0.75 |
| Comparative Example 28 | 283 | — | — | 0 | 1.1 | 0.4 |

TABLE 14-continued

| | | | | | | |
|---|---|---|---|---|---|---|
| Comparative Example 29 | 283 | 290 | 7 | 15 | 1.1 | 0.55 |
| Comparative Example 30 | 283 | 290 | 7 | 30 | 1.1 | 0.55 |

| | | Peel Strength in Multilayer Circuit Board(kN/m) | | | |
|---|---|---|---|---|---|
| | Insertion Loss (db/cm) | Interface 50: Peel Strength between Film Face 35 and Surface 27 of Circuit Pattern 37 | Interface 50: Peel Strength between Film Face 35 and Surface 40 across from Metal Foil 3 | Interface 71: Peel Strength between Films | Interface 23: Peel Strength between Films |
| Example 44 | −0.77 | 0.9 | 1.1 | 1.3 | 1.1 |
| Example 45 | −0.77 | 0.7 | 1.1 | 1.3 | 1.0 |
| Example 46 | −0.77 | 0.7 | 0.9 | 1.1 | 1.0 |
| Comparative Example 28 | −0.77 | 0.4 | 0.3 | 0.4 | 0.5 |
| Comparative Example 29 | −0.77 | 0.8 | 0.9 | 1.2 | 1.0 |
| Comparative Example 30 | −0.77 | 0.8 | 0.8 | 1.2 | 0.9 |

TABLE 15

| | Film Melting Point Tm (° C.) | Heat Treatment Temperature Ta (° C.) | Ta − Tm (° C.) | Heat Treatment Time (min) | Surface Roughness of Copper Foil (μm) | Interface 34: Peel Strength between Copper Foil and Film (kN/m) |
|---|---|---|---|---|---|---|
| Example 47 | 283 | 290 | 7 | 0.15 | 0.5 | 0.9 |
| Example 48 | 283 | 290 | 7 | 1 | 0.5 | 1 |
| Example 49 | 283 | 290 | 7 | 5 | 0.5 | 0.95 |
| Comparative Example 31 | 283 | — | — | 0 | 0.5 | 0.2 |
| Comparative Example 32 | 283 | 290 | 7 | 15 | 0.5 | 0.6 |
| Comparative Example 33 | 283 | 290 | 7 | 30 | 0.5 | 0.6 |

| | | Peel Strength in Multilayer Circuit Board(kN/m) | | | |
|---|---|---|---|---|---|
| | Insertion Loss (db/cm) | Interface 50: Peel Strength between Film Face 35 and Surface 27 of Circuit Pattern 37 | Interface 50: Peel Strength between Film Face 35 and Surface 40 across from Metal Foil 3 | Interface 71: Peel Strength between Films | Interface 23: Peel Strength between Films |
| Example 47 | −0.4 | 0.9 | 1.2 | 1.3 | 1.1 |
| Example 48 | −0.4 | 0.7 | 1.2 | 1.3 | 1.0 |
| Example 49 | −0.4 | 0.7 | 1.1 | 1.1 | 1.0 |
| Comparative Example 31 | −0.4 | 0.4 | 0.3 | 0.4 | 0.5 |
| Comparative Example 32 | −0.4 | 0.8 | 0.9 | 1.2 | 1.0 |
| Comparative Example 33 | −0.4 | 0.8 | 0.8 | 1.2 | 0.9 |

TABLE 16

| | Film Melting Point Tm (° C.) | Heat Treatment Temperature Ta (° C.) | Ta − Tm (° C.) | Heat Treatment Time (min) | Surface Roughness of Copper Foil (μm) | Interface 34: Peel Strength between Copper Foil and Film (kN/m) |
|---|---|---|---|---|---|---|
| Example 50 | 315 | 320 | 5 | 0.15 | 0.9 | 0.9 |
| Example 51 | 315 | 320 | 5 | 1 | 0.9 | 1 |
| Example 52 | 315 | 320 | 5 | 5 | 0.9 | 0.95 |

TABLE 16-continued

| | | | | | | |
|---|---|---|---|---|---|---|
| Comparative Example 34 | 315 | — | — | 0 | 0.9 | 0.2 |
| Comparative Example 35 | 315 | 320 | 5 | 15 | 0.9 | 0.6 |
| Comparative Example 36 | 315 | 320 | 5 | 30 | 0.9 | 0.6 |

| | | Peel Strength in Multilayer Circuit Board(kN/m) | | | |
|---|---|---|---|---|---|
| | Insertion Loss (db/cm) | Interface 50: Peel Strength between Film Face 35 and Surface 27 of Circuit Pattern 37 | Interface 50: Peel Strength between Film Face 35 and Surface 40 across from Metal Foil 3 | Interface 71: Peel Strength between Films | Interface 23: Peel Strength between Films |
| Example 50 | −0.62 | 0.8 | 1.1 | 1.2 | 1.0 |
| Example 51 | −0.62 | 0.7 | 1.1 | 1.2 | 0.9 |
| Example 52 | −0.62 | 0.7 | 0.9 | 1.0 | 0.9 |
| Comparative Example 34 | −0.62 | 0.2 | 0.4 | 0.4 | 0.5 |
| Comparative Example 35 | −0.62 | 0.5 | 0.8 | 1.0 | 0.8 |
| Comparative Example 36 | −0.62 | 0.5 | 0.7 | 1.0 | 0.7 |

TABLE 17

| | Film Melting Point Tm (° C.) | Heat Treatment Temperature Ta (° C.) | Ta − Tm (° C.) | Heat Treatment Time (min) | Surface Roughness of Copper Foil (μm) | Interface 34: Peel Strength between Copper Foil and Film (kN/m) |
|---|---|---|---|---|---|---|
| Example 53 | 283 | 300 | 17 | 0.5 | 0.9 | 1.05 |
| Example 54 | 283 | 300 | 17 | 1 | 0.9 | 1.3 |
| Example 55 | 283 | 300 | 17 | 5 | 0.9 | 0.8 |
| Example 56 | 283 | 290 | 7 | 2 | 0.9 | 1 |
| Example 57 | 283 | 290 | 7 | 5 | 0.9 | 0.75 |
| Example 58 | 283 | 285 | 2 | 2 | 0.9 | 0.7 |
| Example 59 | 283 | 285 | 2 | 5 | 0.9 | 0.8 |
| Comparative Example 37 | 283 | 300 | 17 | 15 | 0.9 | 0.65 |
| Comparative Example 38 | 283 | 290 | 7 | 30 | 0.9 | 0.6 |
| Comparative Example 39 | 283 | 285 | 2 | 15 | 0.9 | 0.45 |
| Comparative Example 40 | 283 | 285 | 2 | 30 | 0.9 | 0.5 |

| | | Peel Strength in Multilayer Circuit Board(kN/m) | | | |
|---|---|---|---|---|---|
| | Insertion Loss (db/cm) | Interface 50: Peel Strength between Film Face 35 and Surface 27 of Circuit Pattern 37 | Interface 50: Peel Strength between Film Face 35 and Surface 40 across from Metal Foil 3 | Interface 71: Peel Strength between Films | Interface 23: Peel Strength between Films |
| Example 53 | −0.62 | 0.9 | 1.1 | 1.3 | 1.1 |
| Example 54 | −0.62 | 0.8 | 1.2 | 1.3 | 1.0 |
| Example 55 | −0.62 | 0.8 | 1 | 1.1 | 1.0 |
| Example 56 | −0.62 | 0.8 | 1.1 | 1.2 | 1.1 |
| Example 57 | −0.62 | 0.8 | 1.1 | 1.2 | 1.0 |
| Example 58 | −0.62 | 0.7 | 1 | 1.0 | 1.1 |
| Example 59 | −0.62 | 0.7 | 1.2 | 1.2 | 1.1 |
| Comparative Example 37 | −0.62 | 0.8 | 0.6 | 0.5 | 0.6 |
| Comparative Example 38 | −0.62 | 0.8 | 0.6 | 0.7 | 0.6 |
| Comparative Example 39 | −0.62 | 0.7 | 0.7 | 0.6 | 0.6 |
| Comparative Example 40 | −0.62 | 0.7 | 0.6 | 0.7 | 0.6 |

The single-sided metal-clad laminate sheet 1 was produced in Examples 34 to 59 through the heat treatment in which the heat treatment temperature Ta was set to range between 1° C. inclusive and 50° C. exclusive higher than the melting point Tm of the thermoplastic liquid crystal polymer film, and the heat treatment was provided for one second to 10 minutes. Tables 13 to 17 show that such a single-sided metal-clad laminate sheet 1 has a high frequency characteristic, and an peel strength of 0.7 kN/m or higher at the interface 34 between the thermoplastic liquid crystal polymer film and the metal foil and at the interfaces 50, 71, and 23 between the single-sided metal-clad laminate sheet 1 and another substrate. Using the single-sided metal-clad laminate sheet 1, the obtained multilayer circuit boards 38, 60, and 61 excel in peel strength and high frequency characteristic.

Meanwhile, the single-sided metal-clad laminate sheets used in Comparative Examples 22 to 40 had either no heat treatment or a heat treatment over 10 minutes. As a result, the peel strength is lower than 0.7 kN/m at the interface between a thermoplastic liquid crystal polymer film and a metal foil, and a portion of the peel strength is lower than 0.7 kN/m between a film face and another substrate.

Suppose such a single-sided metal-clad laminate sheet having low peel strength at an interface is used. Even though the peel strength between a film face and another substrate is assumed to be 0.7 kN/m or higher, the single-sided metal-clad laminate sheet itself is not sufficiently strong, and thus cannot withstand processing. Hence, this single-sided metal-clad laminate sheet has no practical use.

INDUSTRIAL APPLICABILITY

As described above, the present invention relates to a method for manufacturing a metal-clad laminate sheet including thermoplastic liquid crystal polymer film. The present invention also relates to a metal-clad laminate sheet manufactured by this method.

DESCRIPTION OF REFERENCE CHARACTERS

1 Metal-Clad Laminate Sheet
2 Thermoplastic Liquid Crystal Polymer Film
3 Metal Foil (metal foil)
4 Delivery Roll
5 Delivery Roll
6 Laminate Sheet
7 Heating Roll
8 Heat-Resistant Rubber Roll
9 Heating Metal Roll
10 Continuous Hot-Press Apparatus
11 Nip Roll
12 Heat Treatment Unit
13 Wind-Up Roll
15 Laminate Sheet
20 Metal-Clad Laminate Sheet
25 Film Substrate
30 Continuous Hot-Press Apparatus
36 Circuit Board
38 Multilayer Circuit Board
60 Multilayer Circuit Board
61 Multilayer Circuit Board

The invention claimed is:

1. A metal-clad laminate sheet, comprising:
   a thermoplastic liquid crystal polymer film; and
   a metal foil bonded to at least one surface of the thermoplastic liquid crystal polymer film, wherein a surface of the metal foil bonded to the at least one surface of the thermoplastic liquid crystal polymer film has a surface roughness of less than 2.0 μm,
   wherein the thermoplastic liquid crystal polymer film is provided with a skin layer on the at least one surface, and
   the skin layer has a thickness less than or equal to the surface roughness of the metal foil.

2. The metal-clad laminate sheet of claim 1, wherein the thermoplastic liquid crystal polymer film has a coefficient of thermal expansion ranging from 10 ppm/° C. to 30 ppm/° C., and a dimensional variation of not over ±0.1%.

3. The metal-clad laminate sheet of claim 1, wherein the surface roughness of the metal foil is 1.1 μm or less.

4. The metal-clad laminate sheet of claim 1, wherein the thermoplastic liquid crystal polymer film has a thickness ranging from 20 μm to 500 μm.

* * * * *

UNITED STATES PATENT AND TRADEMARK OFFICE
CERTIFICATE OF CORRECTION

| | | |
|---|---|---|
| PATENT NO. | : 10,987,911 B2 | Page 1 of 1 |
| APPLICATION NO. | : 15/567748 | |
| DATED | : April 27, 2021 | |
| INVENTOR(S) | : Takahiro Nakashima et al. | |

It is certified that error appears in the above-identified patent and that said Letters Patent is hereby corrected as shown below:

On the Title Page

On page 2, Column 2, Line 13, Item (56), under FOREIGN PATENT DOCUMENTS:
"WO WO 2015/0079415 A1 10/2013"
Should read:
-- WO 2013/147115 A1 10/2013 --

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*